United States Patent
Wang et al.

(10) Patent No.: US 10,594,145 B1
(45) Date of Patent: Mar. 17, 2020

(54) METHOD FOR OPERATION OF DEVICE USING BATTERY STATE OF HEALTH

(71) Applicant: Amazon Technologies, Inc., Seattle, WA (US)

(72) Inventors: John Wang, Sunnyvale, CA (US); Kamran Mohajer, Lake Sherwood, CA (US); Yuting Yeh, Sunnyvale, CA (US)

(73) Assignee: AMAZON TECHNOLOGIES, INC., Seattle, WA (US)

(*) Notice: Subject to any disclaimer, the term of this patent is extended or adjusted under 35 U.S.C. 154(b) by 148 days.

(21) Appl. No.: 15/816,191

(22) Filed: Nov. 17, 2017

(51) Int. Cl.
*H02J 7/00* (2006.01)

(52) U.S. Cl.
CPC .......... *H02J 7/0031* (2013.01); *H02J 7/0047* (2013.01)

(58) Field of Classification Search
CPC .................................................... H02J 7/0031
USPC ........................................................ 320/132
See application file for complete search history.

(56) References Cited

U.S. PATENT DOCUMENTS

| | | | |
|---|---|---|---|
| 7,688,033 B2* | 3/2010 | Minamiura | G01R 31/389 320/134 |
| 9,465,080 B2* | 10/2016 | Wiegman | G01R 31/3842 |
| 2018/0254641 A1* | 9/2018 | Kadirvel | H02J 7/0026 |

* cited by examiner

*Primary Examiner* — Edward Tso
*Assistant Examiner* — Ahmed H Omar
(74) *Attorney, Agent, or Firm* — Quarles and Brady LLP

(57) ABSTRACT

A system and method for operating a portable electronic device are presented. The device includes a battery and a controller. The controller is configured to execute instructions for determining a first resistance value for the battery during a first power cycle of the battery, and determining a second resistance value for the battery during a second power cycle of the battery. The second power cycle is after the first power cycle. The controller is configured to execute instructions for determining that a first difference equal to the first resistance value subtracted from the second resistance value is less than a first predetermined threshold value, and electrically isolating the battery. In an embodiment, the first resistance value and the second resistance values are determined at the same state of charge for the battery.

18 Claims, 10 Drawing Sheets

METHOD FOR OPERATION OF DEVICE USING BATTERY STATE OF HEALTH

BACKGROUND

Batteries are used in numerous types of portable electronic devices including, without limitation, electronic book ("eBook") readers, mobile phones, laptop computers, and augmented reality devices. The battery capacity of a device determines the effective run-time for that device from the time the battery is fully charged to the time the battery's charge is depleted. This run-time may diminish over time as the battery is repeatedly charged and discharged, due to degradation of the battery that occurs with use. Thus, a battery's capacity may be an indicator of the battery's state of health.

Another potential indicator of a battery's state of health involves battery resistance. Over time, as a battery is repeatedly charged and discharged, the resistance of the battery may increase gradually. This gradual resistance increase may escalate in magnitude as the battery draws closer to the end of its usable life. Additionally, it is possible for a battery to become internally short circuited, which could cause a failure event to occur. An internal short circuit in a battery may be characterized by a decrease in battery resistance. Thus, a battery's resistance may be an indicator of the battery's state of health.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1:
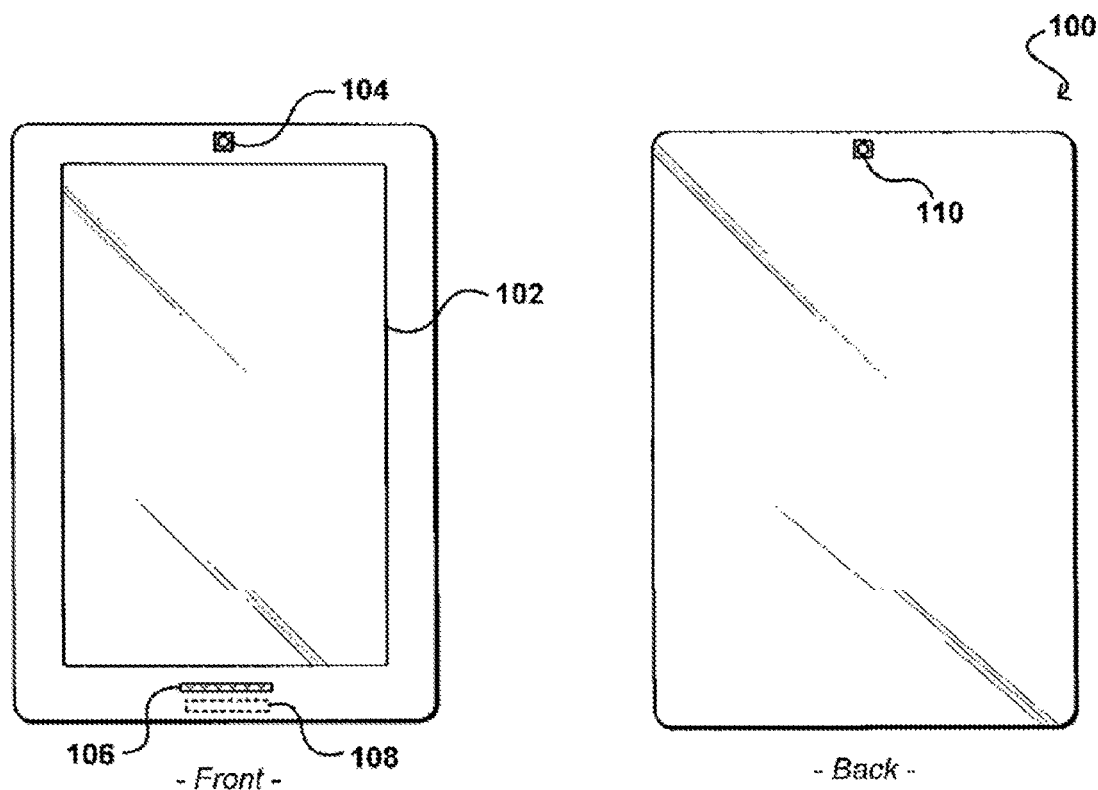
FIG. 1 illustrates front and back views of an example electronic device that can be used in accordance with various embodiments.

In various embodiments described herein, electronic devices include power management circuitry for controlling battery operations and for monitoring resistance and capacity of the battery over time. In some examples, the electronic devices may include one or more components associated with power management, such as voltage sensor circuits that measure voltage across a battery, and current sensor circuits that measure current output of a battery. The electronic devices may be portable consumer electronic devices such as tablets, eReaders, phones, watches, and the like.

Data collected by voltage and current sensor circuits in an electronic device can be used to generate voltage and current measurements for the electronic device. Methods can be implemented based on these measurements that allow for the estimation of resistance and capacity for a battery in the electronic device. The battery's capacity for storing electrical charge, which may be an indicator of battery health, may be tracked over time in order to determine a battery capacity rate of change. The battery capacity rate of change may be utilized to provide feedback to an operator of the device regarding the health of the device's battery, potential assisting the operator in making a determination to replace the device's battery.

Accurately estimating battery resistance can be important for enabling the accurate determination of state of charge (SoC) and battery capacity (Q) values for the battery. In the present system, a controller or processor in a device continuously monitors voltage, temperature, and current sensor data for the device and performs one or more algorithms in which these data are continuously used to calculate one or more of a present estimated resistance for a battery, a change in estimated resistance for the battery, state of charge for the battery, open circuit voltage for the battery, battery capacity, and rate of change of battery capacity. The results of these calculations can then be used as a basis for determining when and if particular power management functions should be performed in the device and when notifications should be sent to a user indicating that the battery is experiencing accelerated degradation, is degraded past a predetermined threshold, or is close to failure, for example. The algorithm used for estimating resistance of the battery can be recursive in that past parameters used to perform old or previous resistance estimates are fed back into the algorithm as inputs for estimating a new (i.e., present) resistance of the battery.

For example, a recursive updating algorithm (RUA) may be used to estimate battery resistance in a device. The RUA may, in some embodiments, utilize a Kalman filter to estimate the resistance of the battery. The Kalman filter, also known as a linear quadratic estimate, can be used to estimate the state of a system, in this case resistance of a battery, based on a series of measurements observed over time, and can be more accurate and less noisy than estimation based on a single measurement. If desired, however, other filtering methods such as least-square-methods-with-adaptive-weight (LSMAW) may be used in estimating resistance for the battery in order to similarly reduce noise in the battery resistance estimates. When a device is first initialized and historical data is not available, a look up table (LUT) containing resistance values for various voltage and temperature values can be used as a basis for estimating an initial battery resistance value using voltage and temperature values acquired from the voltage and temperature sensor circuitry. For example, the LUT may be relied upon to estimate resistance when a device is detected to have transitioned from an off state to an on state or from a sleep state to an on state.

By monitoring changes in estimated battery resistance and battery capacity, the device may determine when the device's battery is nearing the end of the battery's usable life, and a user can be notified accordingly. Additionally, by monitoring change in estimated battery resistance between battery power cycles, decreases in estimated battery resistance that occur between battery power cycles can be identified so that a user can be warned of a potential short in the battery and/or so that the battery may be electrically isolated in an attempt to prevent undesirable events that may occur as a result of internal battery short circuits.

FIG. 1 illustrates front and back views, respectively, of an example electronic user device 100 that can be used in accordance with various embodiments. Although a portable computing device (e.g., an electronic book reader or tablet computer) is shown, it should be understood that any electronic device capable of receiving and processing input, or at least capable of communicating and/or being charged, can be used in accordance with various embodiments discussed herein, where the devices can include, for example, desktop computers, notebook computers, personal data assistants, smart phones, video gaming consoles, television set top boxes, and portable media players. In this example, the user device 100 has an electronic display screen 102 on the front side, which under normal operation will display information to a user facing the display screen (e.g., on the same side of the computing device as the display screen). The electronic display screen 102 may include a lighting component, such as a backlight or front light, which provides illumination for the electronic display screen 102. The lighting component may be powered using a pulse width modulation signal provided by a power supply, and the duty cycle of this pulse width modulation signal may determine the intensity of the illumination provided by the lighting component (e.g., corresponding to the brightness of the electronic display screen 102). By adjusting the duty cycle of the pulse width modulation signal, the intensity of the illumination can be adjusted which, in turn, controls how much power is consumed from the batter of device 100. The computing device in this example includes at least one front image capture element 104 and at least one back image capture element 110 positioned on the device such that, with sufficient lenses and/or optics, the user device 100 is able to capture image information in substantially any direction about the computing device. The example user device 100 also includes at least one microphone 106 or other audio capture device capable of capturing audio data, such as words spoken by a user of the device or sounds indicative of an environment in which the device can currently be found.

The example user device 100 also includes at least one position and/or orientation determining element 108. Such an element can include, for example, an accelerometer or gyroscope operable to detect an orientation and/or change in orientation of the user device 100. An orientation determining element also can include an electronic or digital compass, which can indicate a direction (e.g., north or south) in which the device is determined to be pointing (e.g., with respect to a primary axis or other such aspect). A location determining element also can include or comprise a global positioning system (GPS) or similar positioning element operable to determine relative coordinates for a position of the computing device. Various embodiments can include one or more such elements in any appropriate combination. As should be understood, the algorithms or mechanisms used for determining relative position and/or orientation can depend at least in part upon the selection of elements available to the device.

Figure 2:
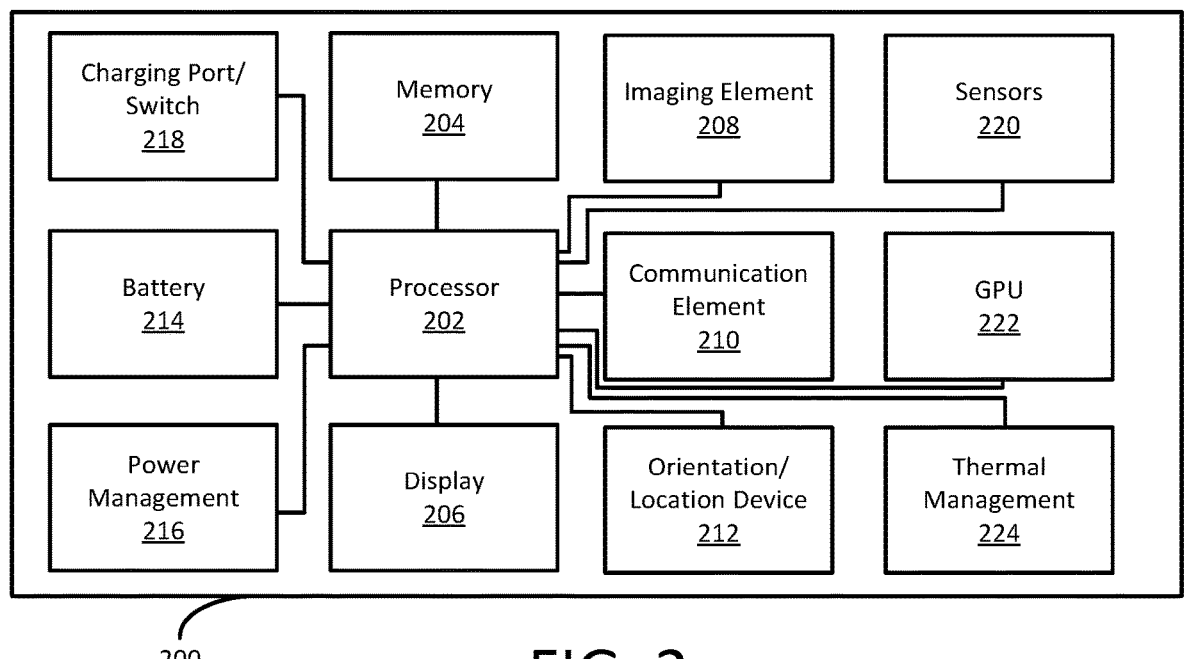
FIG. 2 illustrates example components of an example electronic device that can be used in accordance with various embodiments.

FIG. 2 illustrates a logical arrangement of a set of general components of an example computing device 200 such as the user device 100 described with respect to FIG. 1, which may be a portable electronic device. In this example, the device includes a processor 202 (e.g., which may be part of a controller) for executing instructions that can be stored in a memory device or element 204. As would be apparent to one of ordinary skill in the art, the device can include many types of non-transitory and/or transitory memory, data storage, or non-transitory computer-readable storage media, such as a first data storage for program instructions for execution by the processor 202 (e.g., by the controller), a separate storage for images or data, a removable memory for sharing information with other devices, etc. The device typically will include some type of display element 206, such as a touch screen, a liquid crystal display (LCD), or an electrowetting display, although devices such as portable media players might convey information via other means, such as through audio speakers. The display element 206 may include a lighting component that provides illumination for the display element 206. The lighting component may be powered using a pulse width modulation signal provided by a power supply, and the duty cycle of this pulse width modulation signal may determine the intensity of the illumination provided by the lighting component (e.g., corresponding to the brightness of the display element 206) and, thereby, the power consumption of the lighting component. As discussed, the device in many embodiments will include at least one image capture element 208 such as a camera or infrared sensor that is able to image a user, people, or objects in the vicinity of the device. It should be understood that image capture can be performed using a single image, multiple images, periodic imaging, continuous image capturing, image streaming, etc. Further, a device can include the ability to start and/or stop image capture, such as when receiving a command from a user, application, or other device. The device also can include one or more orientation and/or location determining elements 212, such as an accelerometer, gyroscope, electronic compass, or GPS device as discussed above. These elements can be in communication with the processor in order to provide the processor with positioning and/or orientation data.

In some embodiments, the computing device 200 of FIG. 2 can include one or more sideband or other such communication elements (not shown), such as a Wi-Fi, Bluetooth, RF, or another wireless communication system, enabling the user device to communicate with other devices or components, such as a charger or docking station. In some embodiments the device can include at least one additional input device able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device.

The example device 200 also includes a battery 214 or other appropriate power source. The power source can include, for example, at least one rechargeable battery, and can include other elements as well such as solar power cells or other such elements. The device also can include an intelligent charging port or switch 218, in at least some embodiments, which is controllable by the processor 202. The device might be plugged into an outlet or placed into a charging station, for example, but in at least some embodiments the charging switch 218 can control whether or not power is actually passed on to the battery for purposes of charging. For example, if the battery has almost no remaining charge then the switch might close in order to allow power to charge the battery, while in the case of a battery 214 that is nearly fully charged the charging switch 218 might open such that no charge passes to the battery at the current time. In some embodiments, the user can override such settings, whereby the device might always accept a charge or only accept a charge upon certain user settings, etc.

Example device 200 may also include at least one power management module or component 216, which can be implemented in software and/or hardware in communication with, or executed by, at least one processor 202 of the device 200. In at least some embodiments, the power management module 216 can monitor various aspects of the device, and its usage by a user, to determine when to adjust a functional state of at least one component of the device. For example, in response to detecting that real-time (e.g., instantaneous) power usage of device 200 exceeds a predetermined power usage threshold, power management module 216 may reduce the power usage of the device by throttling the performance of one or more power-intensive components of device 200 (e.g., by reducing an operating frequency of processors or by dimming display element 206 of device 200) or by disabling one or more functions of device 200 (e.g., by disabling WiFi, Bluetooth, or global positioning system (GPS) functions of device 200 and components associated with these functions). Herein, power usage of a device is defined as the current being drawn from a battery within the device times the voltage across the battery. Real-time power usage is the power usage at the time the current being drawn from a battery and the voltage across the battery are measured.

Similarly, device 200 may include thermal management module (or component) 224, which can be implemented in software and/or hardware in communication with, or executed by, processor 202 of device 200. In at least some embodiments, the thermal management module 224 can monitor and adjust various aspects of device 200 and its usage by a user to determine when to adjust a functional state of at least one component of the device. For example, in response to detecting that the temperature in a region of device 200 has exceeded a predetermined thermal trip threshold (e.g., a threshold trip temperature) for that region, the thermal management module 224 may reduce the power usage of the device by throttling the performance of one or more heat generating components of device 200 (e.g., by reducing an operating frequency of processors or by dimming the display element 206 of device 200) or by disabling one or more functions of device 200 (e.g., by disabling WiFi, Bluetooth, or global positioning system (GPS) functions of device 200 and components associated with these functions).

The example device 200 also includes a graphics processing unit (GPU) 222. GPUs are specialized processors configured to perform graphics-related operations, and may be used to accelerate rending of 2-dimensional or 3-dimensional graphics and/or to reduce the processing load placed on processor 202. GPUs may be more effective than general purpose processors for performing complex algorithms that may be required for various graphics intensive tasks, such as gaming, due to the highly parallel structure of GPUs. GPU 222 may be a significant source of heat while performing graphics-intensive processing tasks for device 200.

The example device 200 also includes sensors 220, which may include one or more temperature sensors, voltage sensors, and current sensors. Temperature sensors included in sensors 220 may be placed on or near sources of heat in the device, such as the central processing unit (CPU) (e.g., processor 202) of the device, GPU 222, the device display, and battery 214. These temperature sensors each sense temperatures in their respective regions and generate temperature data based on the sensed temperatures over time. The temperature sensors may include thermocouples, thermistors, infrared temperature sensors, resistance temperature detectors, or any other desired type of temperature sensor. Voltage sensors included in sensors 220 may be placed across various components in device 200 to detect voltages across those components, which may include, for example, battery 214, processor 202, and GPU 222. The voltage sensors may produce voltage data that includes these detected voltages. The voltage sensors may include capacitive or resistive type voltage sensors, or any other desired type of voltage sensor. Current sensors included in sensors 220 may be placed at inputs and/or outputs of various components in device 200 to detect currents flowing into or out of those components, which may include, for example, battery 214, processor 202, and GPU 222. The current sensors may include Hall Effect sensors, current clamp sensors, resistor-based current sensors, or any other desired type of current sensor. The temperature data, current data, and voltage data described above may, for example, be converted from analog format to digital format by analog-to-digital conversion circuitry in device 200 before being provided to processor 202.

Figure 3A:
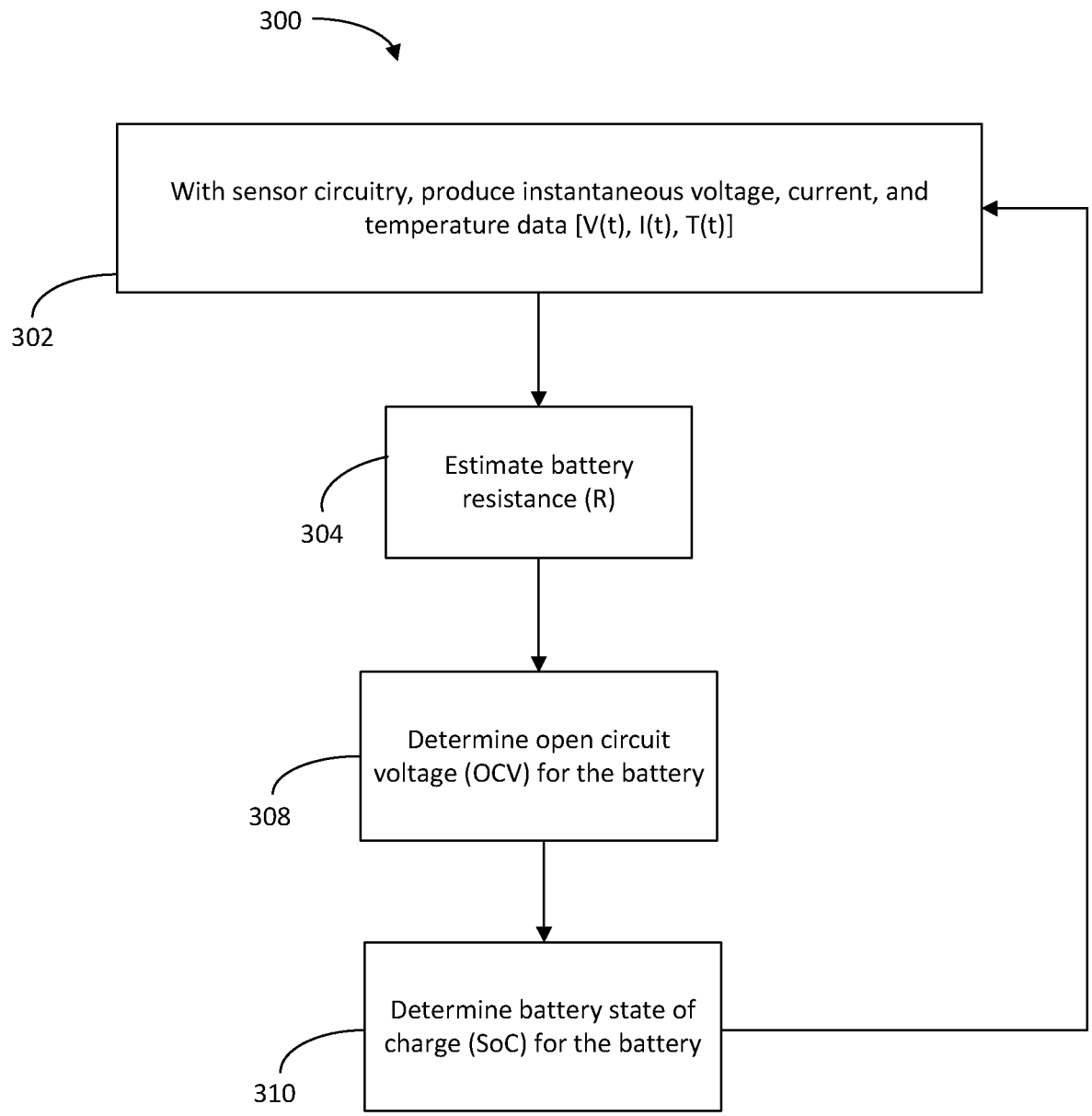
FIG. 3A illustrates an example method for determining an estimated resistance and a state of charge for a battery in a device.

FIG. 3A illustrates a method 300 by which a device such as device 200 (or any analogous device) may determine a state of charge (SoC) for a battery such as battery 214. Method 300 may be implemented, for example, by a controller or processor of the device, such as processor 202 of FIG. 2. At step 302, voltage, current, and temperature data are received that respectively include voltages, currents, and temperatures measured for various components in device 200. For example, a voltage sensor in sensor circuitry 220 may continuously measure voltages across terminals of battery 214 in device 200 and may produce voltage data V(t) that includes the measured voltages and the corresponding times at which these voltages are measured. Once received, the voltage data may be stored in non-transient memory 204. Previously measured voltages in voltage data V(t) are referred to herein as historical voltages for battery 214.

A current sensor in sensor circuitry 220 may continuously measure current flowing into or out of a given terminal of battery 214 and may produce current data I(t) that includes the measured currents and the corresponding times at which these currents are measured. The most recently measured current value in current data I(t) is referred to herein as an instantaneous current for battery 214. Other previously measured currents in current data I(t) are referred to herein as historical currents for battery 214.

A temperature sensor in sensor circuitry 220 may continuously measure temperatures at a component (e.g., battery 214 or GPU 222) in device 200 and may produce temperature data T(t) that includes the measured temperatures and the corresponding times at which these temperatures were measured. Processor 202 may sample the measured temperatures from the temperature data at a defined sampling rate. Previously measured temperatures in temperature data T(t) are referred to herein as historical temperatures for battery 214.

The voltage data V(t), current data I(t), and temperature data T(t) produced by sensor circuitry 220 are received by processor 202. It should be noted that other voltage, current, and temperature sensors may be included in sensor circuitry 220 at various locations in device 200, and that these sensors may contribute to the voltage data V(t), current data I(t), and temperature data T(t).

At step 304, the resistance of the battery is estimated. For example, processor 202 may estimate the resistance of battery 214 using one of multiple methods for resistance estimation based on the present conditions of battery 214 and device 200. Methods by which battery resistance may be estimated are described in greater detail below in connection with FIG. 4.

At step 308, the open circuit voltage (OCV) of the battery is determined. OCV is the voltage that is present across two terminals of a battery when the battery is not connected to anything (e.g., when the terminals are in an open circuit). For example, using processor 202, the OCV may be determined or estimated according to the following equation:

$$OCV = V_t - (I_t * R) \quad (2)$$

In equation (2), $V_t$ is the instantaneous terminal voltage measured across the battery (e.g., the most recently detected voltage of the voltage data V(t) produced by the voltage sensor in sensor circuitry 220 in step 302), I(t) is the instantaneous current flowing through a terminal of the battery (e.g., the most recently detected current of the current data I(t) produced by the current sensor in sensor circuitry 220 in step 302), and R is the estimated resistance of battery 214 that was determined in step 304. It should be noted that $I_t$ will have a positive value when the battery is discharging and a negative value when the battery is charging.

At step 310, the SoC for the battery is determined. A battery's SoC is defined herein as the ratio of the remaining charge of the battery to the nominal capacity of the battery, and is generally expressed as a percentage. The SoC for a battery normally cannot be measured directly, but may be determined based on other variables of the battery, such as OCV and resistance. For example, processor 202 may access a look up table (LUT) stored in memory 204 of device 200 in order to determine the SoC for the battery based on the estimated resistance determined in step 304 and based on the OCV determined in step 308. If desired, the SoC for the battery may be determined using an alternative method, such as coulomb counting.

Upon the completion of step 310, method 300 returns to step 302 and the process is repeated. In this way, the SoC for the battery may be constantly updated at a given rate (which may be adjustable) to provide a real-time determination of SoC for the battery. For example, method 300 may iterate or be executed every 1 second.

Electronic devices such as device 200 may be placed in a sleep mode to minimize power usage during periods of non-use. During this sleep mode, it may be beneficial to continue to determine SoC so that an accurate value for SoC may be maintained throughout the sleep mode (e.g., so that method 300 may be resumed when the device exits sleep mode and resumes normal operation).

Figure 3B:
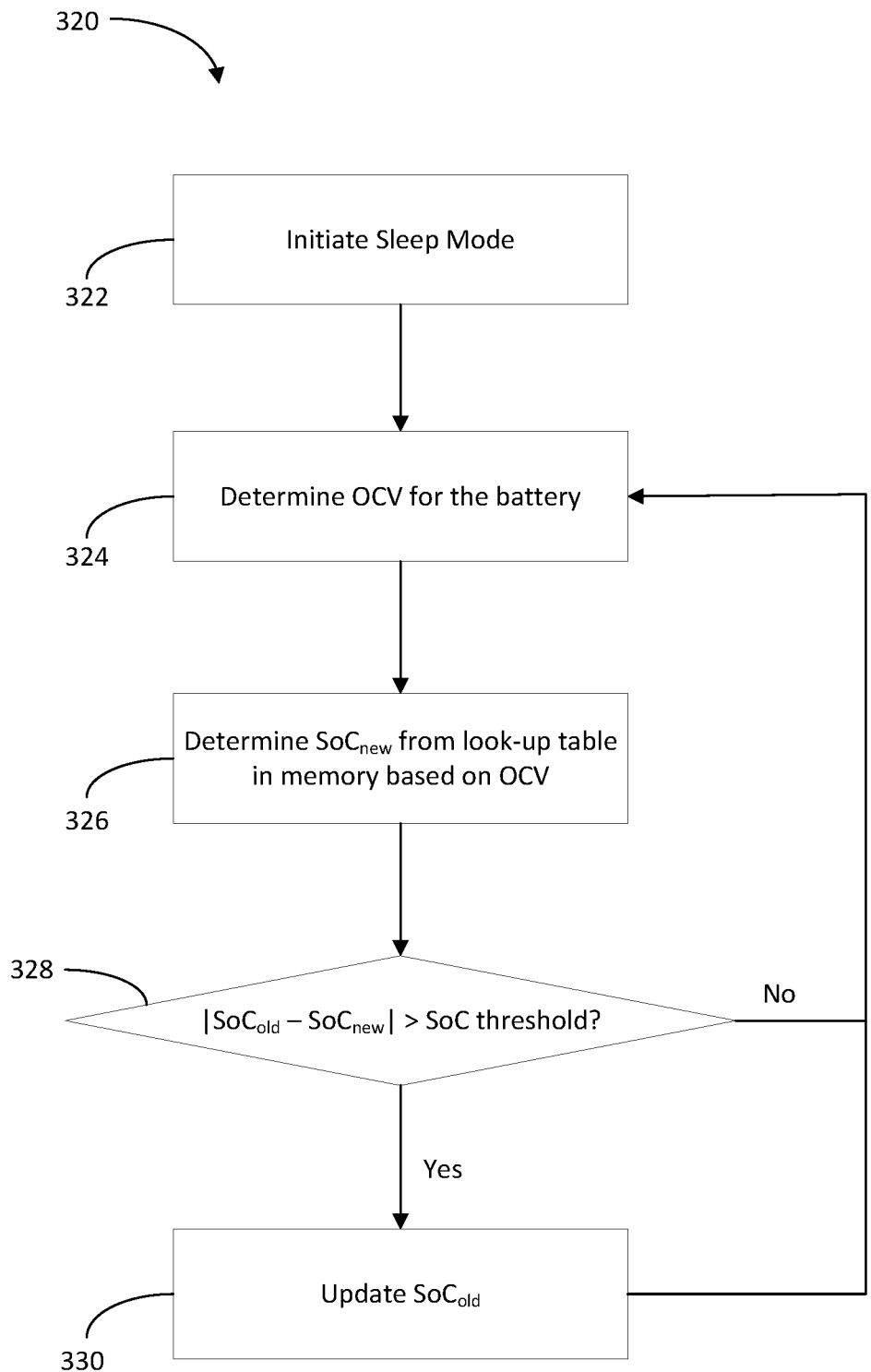
FIG. 3B illustrates an example method for determining a state of charge for a battery in a device while the device is in a sleep mode.

FIG. 3B illustrates a method 320 by which a device such as device 200 (or any analogous device) may continuously determine the SoC for a battery during a sleep mode of the device.

At step 322, sleep mode is initiated for the device. A sleep mode is a state in which the device is not actively being used and power usage in the device is minimized in order to conserve battery life during this low-use state. For example, processor 202 of device 200 may determine that device 200 has not received any user input for a predetermined amount of time and, in response, may place device 200 in sleep mode. Alternatively, processor 202 may place device 200 into sleep mode in response to a user input associated with the sleep mode.

At step 324 the OCV for the battery is determined, similarly to how OCV for the battery is determined using steps 302, 304, and 308, as described above in connection with FIG. 3A. For example, processor 202 may receive a voltage and a current from sensor circuitry 220 and may determine an estimated resistance for battery 214 as described in connection with step 304 above. The OCV for battery 214 may then be determined by processor 202 using the voltage, current, and estimated resistance as described in connection with step 308 above. The loop that includes steps 324, 326, 328, and 330 may be performed periodically for as long as device 200 is in sleep mode at a rate that is comparatively slower than the rate at which method 300 iterates in order to prolong the battery life of battery 214 during the sleep-mode.

At step 326, a new SoC value, $SoC_{new}$, is determined for the battery. For example, processor 202 may access a LUT stored in memory 204 and may use the LUT to determine $SoC_{new}$ using the estimated resistance and the determined OCV, as described in detail above in connection with step 310. Here, $SoC_{new}$ is used as a placeholder variable so that a present SoC value can be determined for battery 214 without updating the SoC value stored in memory 204, which is referred to in this context as $So_{Cold}$.

At step 328, a magnitude of a difference between $So_{Cold}$ and $SoC_{new}$ is compared to a predetermined SoC threshold value stored in memory 204, for example, using processor 202. If the magnitude of the difference is less than the SoC threshold, the value of $So_{Cold}$ is not updated and method 320 returns to step 324. Otherwise, if the magnitude is greater than the SoC threshold, the value of $So_{Cold}$ is updated to be the value of $SoC_{new}$ at step 330 and method 320 returns to step 324. Steps 324-330 may be repeated continuously until either device 200 exits sleep mode (e.g., due to user interaction or due to lack of battery charge).

Electronic devices such as device 200 may retain SoC information when performing shut-down operations so that when the device is started up again, a previously determined value for SoC may be quickly retrieved from memory.

Figure 3C:
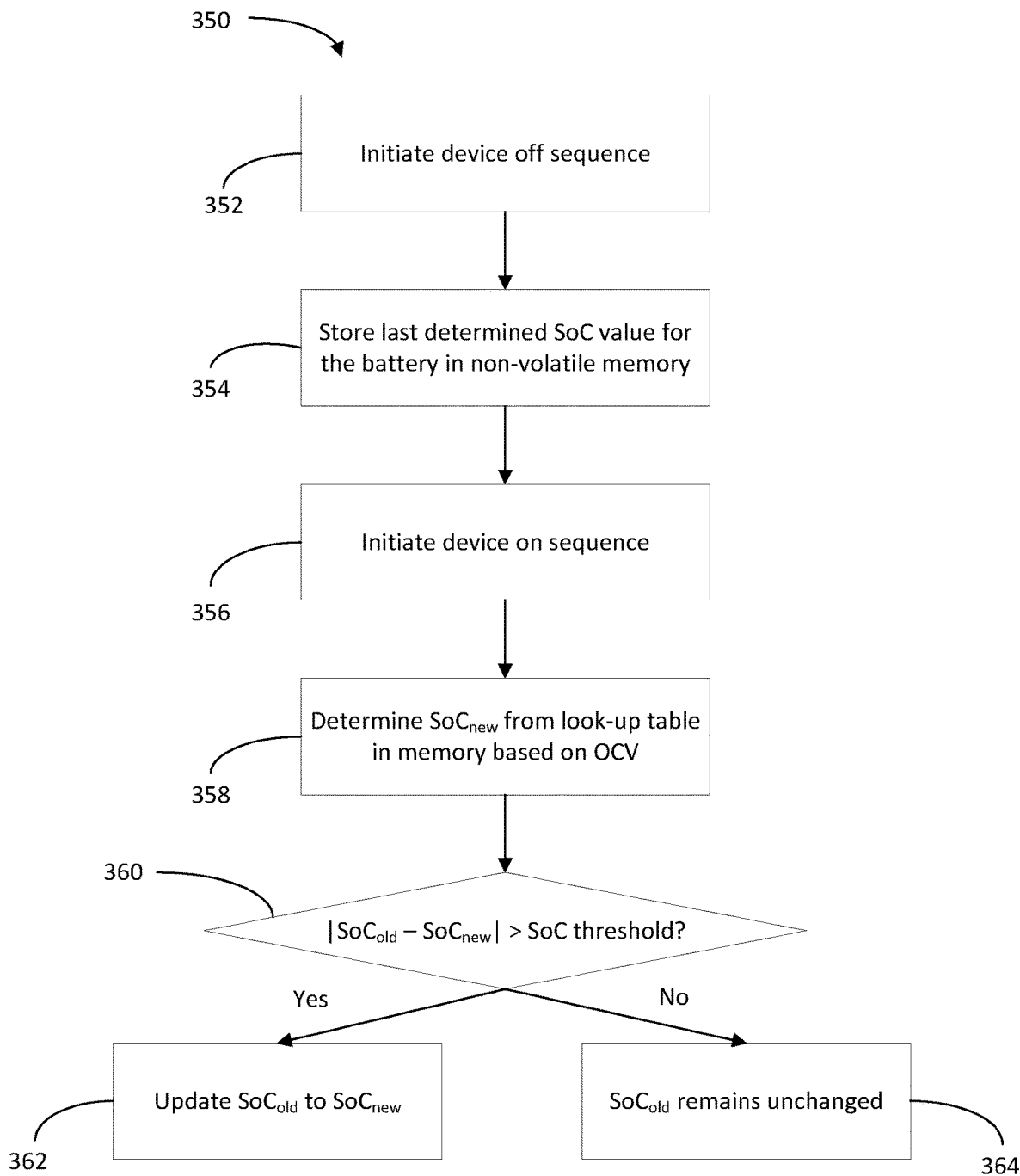
FIG. 3C illustrates an example method for determining a state of charge for a battery in a device when the device is placed into an off state and is then returned to an on state.

FIG. 3C illustrates a method 350 by which a device such as device 200 (or any analogous device) may update SoC for battery 214 upon turning device 200 on after having previously turned device 200 off.

At step 352, the device may initiate an off sequence. For example, processor 202 of device 200 may receive instructions (e.g., generated in response to user input) indicating that device 200 should be turned off (e.g., powered down) or otherwise set into a mode in which device 200 consumes a minimum amount of energy from the device's battery or power supply.

At step 354, a most recently determined SoC for the battery (e.g., as determined using method 300 of FIG. 3A), may be stored in a non-volatile memory of the device before the device is turned off. For example, processor 202 may store the SoC value in memory 204 of device 200 before device 200 is turned off so that the stored value can be retrieved from memory 204 after device is turned back on.

At step 356, the device may initiate an on sequence. For example, processor 202 of device 200 may begin performing boot-up sequences or processes associated with turning on device 200 (e.g., in response to a user input such as the user pressing a power button on device 200).

At step 358, a new SoC value, $SoC_{new}$, is determined for the battery in the device. For example, determining $SoC_{new}$ may involve performing steps 302, 304, 308, and 310 described above in connection with FIG. 3A. Processor 202 may receive a voltage and a current from sensor circuitry 220 and may determine an estimated resistance for battery 214 as described in connection with step 304 above. The OCV for battery 214 may then be determined by processor 202 using the voltage, current, and estimated resistance as described in connection with step 308 above. Processor 202 may then access a LUT stored in memory 204 and may use the LUT to determine $SoC_{new}$ using the estimated resistance and the determined OCV, as described in detail above in connection with step 310. Here, $SoC_{new}$ is used as a placeholder variable so that a present SoC value can be determined for battery 214 without updating the SoC value that was stored in memory 204 at step 354, which is referred to in this context as $So_{Cold}$.

At step 360, a magnitude of a difference between $So_{Cold}$ and $SoC_{new}$ is compared to a predetermined SoC threshold value stored in memory 204, for example, using processor 202. If the magnitude is less than the SoC threshold, the value of $So_{Cold}$ is not updated at step 364. Otherwise, if the magnitude is greater than the SoC threshold, the value of $So_{Cold}$ is updated to be the value of $SoC_{new}$ at step 362.

Figure 4:
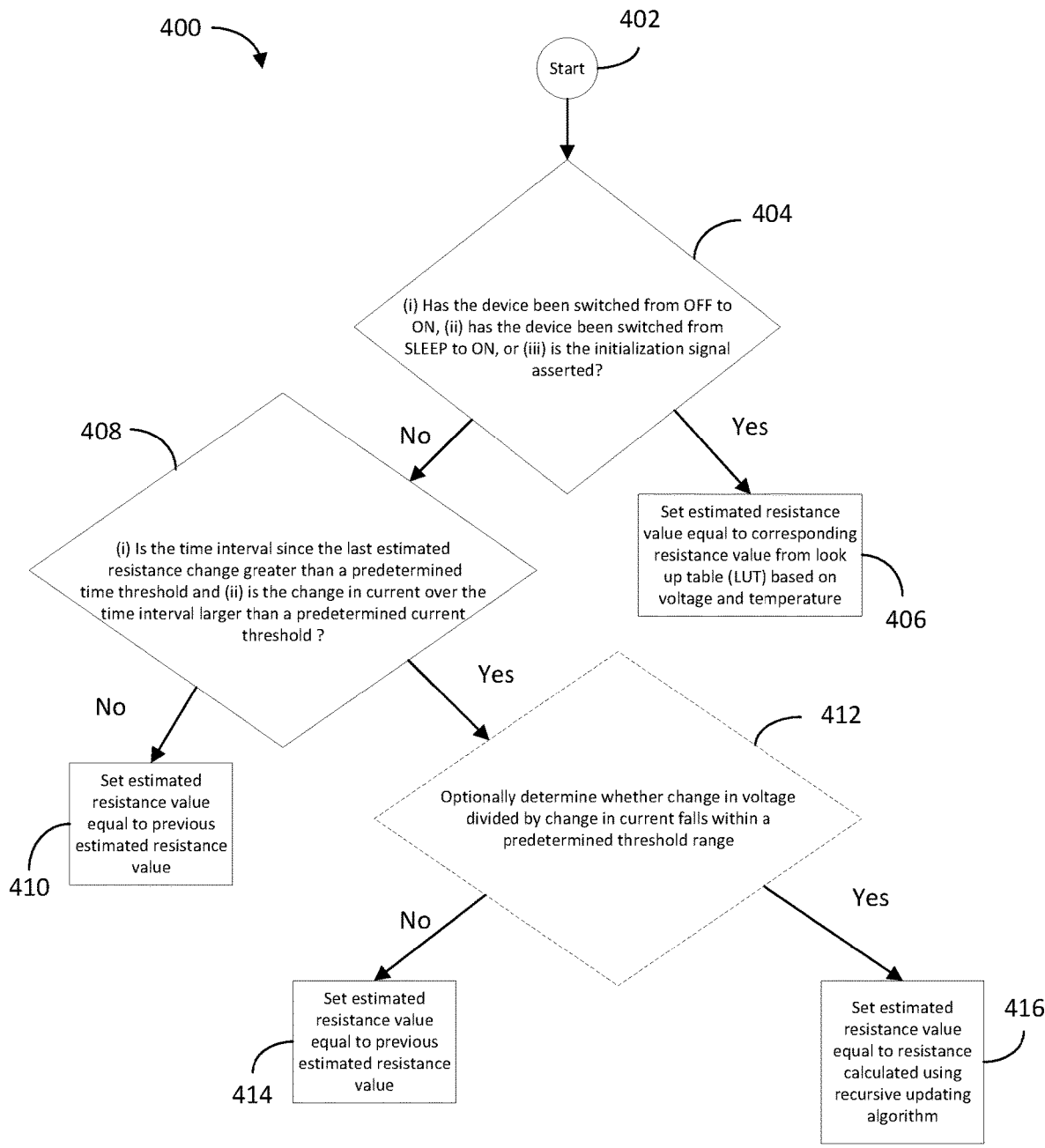
FIG. 4 illustrates an example method for estimating resistance of a battery in a device.

FIG. 4 illustrates a method 400 by which a device such as device 200 (or any analogous device) may estimate the resistance of a battery such as battery 214. Herein, battery resistance (e.g., the resistance of battery 214) is the internal resistance of the battery that opposes the flow of current within the battery. There are three basic components that contribute to the internal resistance of a battery, electronic resistance, ionic resistance, and diffusion resistance. The electronic resistance includes the resistivity of materials that make up the battery, such as metal covers and conductive internal components. The ionic resistance is the resistance to current flow within the battery due to various electrochemical factors such as conductivity of the electrolyte in the battery, ion mobility, and electrode surface area. The diffusion resistance is the resistance to current flow within the battery due to the hindrance of the ion transports in the solid phase.

At step 402, the process begins. Step 402 may, for example, correspond to the beginning of step 304 shown in FIG. 3A.

At step 404, it is optionally determined whether the device is in an initialized state in which there is no available historical resistance data for battery 214. When the device is first initialized, historical resistance data needed for performing other operations (e.g., those that utilize Kalman filtering) to calculate battery resistance may not yet be stored in memory. Thus, it may be necessary to determine whether the device has been initialized so that an appropriate alternative method (e.g., non-recursive) for estimating battery resistance may be implemented when the device is first initialized. For example, processor 202 may optionally determine whether device 200 has been switched from an off state to an on state, whether device 200 has been switched from a sleep state to the on state, which may indicate that historical values, such as parameters S1 and S2, aren't defined and a different approach for estimating resistance is required and whether an initialization signal in device 200 has been asserted. The initialization signal may be, for example, asserted during diagnostic assessment of device 200 and otherwise may not be asserted during normal operation of device 200. If any of the above conditionals are true, method 400 proceeds to step 406. Otherwise, the process proceeds to step 408.

At step 406, in response to determining that the device is in the initialized state (e.g., that any of the conditionals of step 404 are true), an estimated resistance value is produced by comparing voltage and temperature data for the battery to voltage-temperature pairs in a predefined look-up-table (LUT). For example, processor 202 may access a LUT stored in memory 204, which includes a table of predetermined resistances each corresponding to a given temperature and a given voltage (e.g., a voltage-temperature pair). An example LUT that may be used in step 406 is shown as Table 1 below:

TABLE 1

|       | 0° C.   | 10° C.  | 20° C.  | 40° C.  | 60° C.  |
|-------|---------|---------|---------|---------|---------|
| 4.3 V | 0.22 Ω  | 0.12 Ω  | 0.10 Ω  | 0.14 Ω  | 0.16 Ω  |
| 3.8 V | 0.21 Ω  | 0.11 Ω  | 0.09 Ω  | 0.15 Ω  | 0.17 Ω  |
| 3.4 V | 0.20 Ω  | 0.11 Ω  | 0.08 Ω  | 0.13 Ω  | 0.15 Ω  |

As shown in Table 1, temperatures are shown in degrees Celsius, voltages are shown in volts, and resistance values are shown in ohms (Ω). An example of a voltage-temperature pair is 4.3 V and 10° C., which have a corresponding resistance value of 0.12Ω.

Processor 202 may then determine which resistance value of the LUT corresponds to the instant voltage and temperature of battery 214, as identified from the voltage data and the temperature data, and this resistance value will then be selected as the estimated resistance R for battery 214. In some cases, the instant voltage and temperature of battery 214 may not have exact matches in the LUT, in which case interpolation may be performed between resistance values of the LUT that are associated with the voltage-temperature pairs closest to the instant voltage and temperature of battery 214. As an example of performing interpolation with the LUT of Table 1, the instant voltage may be 3.6V and the temperature may be 5° C. The closest corresponding resistance values 0.21 Ω, 0.20 Ω, 0.11 Ω, 0.11Ω may be averaged together in order to produce an interpolated estimated resistance value of 0.1575Ω.

At step 408, in response to determining that the device is not in an initialized state (e.g., that all of the conditionals of step 404 are not true), it is determined whether the device is in a benign state. Here, "benign state" refers to a device state in which at least an amount of time corresponding to a predetermined time threshold has passed since a most recent estimated resistance update for the battery, and in which a change in current since the last estimated resistance update for the battery exceeds a predetermined current change threshold. For example, at time $t_1$ the estimated resistance R for battery 214 may be updated to a new value as part of an estimated resistance update according to the process described in connection with step 416 below. At time $t_2$, processor 202 may perform step 414 to assess whether a difference between time $t_2$ and time $t_1$ exceeds the predetermined time threshold, and to analyze current data I(t) to determine whether a difference between current $I(t_2)$ (e.g., the measured current of battery 214 at time $t_2$) and current $I(t_1)$ (e.g., the measured current of battery 214 at time $t_1$) exceeds the predetermined current change threshold.

This may prevent resistance estimates from being updated too quickly and from being updated without a significant change in current, which could increase an amount of noise or uncertainty in the estimated resistance value. The time difference between times $t_1$ and $t_2$ may be, for example, tracked using a counter implemented in software, with the counter value being incremented every microsecond or millisecond and being reset to zero upon the successful updating of the estimated resistance of battery 214. The counter value may be compared to the predetermined time threshold and the predetermined current threshold, which may be stored in memory 204. If the difference between times $t_1$ and $t_2$ exceeds the predetermined time threshold and if the difference between currents $I(t_1)$ and $I(t_2)$ exceed the predetermined current change threshold, method 400 proceeds to step 412. Otherwise, the process proceeds to step 410.

At step 410, in response to determining that the device is not in a benign state (e.g., that either of the conditionals of step 408 are not true), the estimated resistance R of the battery 214 remains at the old (previous) estimated resistance value (e.g., the estimated battery resistance at $t_1$). In other words, the estimated resistance R of the battery 214 remains unchanged.

At step 412, in response to determining that the device is in the benign state (e.g., that both of the conditionals of step 408 are true), it is optionally determined whether a change in voltage during the time interval from time $t_1$ to time $t_2$ divided by a change in current during the time interval from time $t_1$ to time $t_2$ falls within a predetermined threshold range. For example, processor 202 may identify the difference between voltages $V(t_1)$ and $V(t_2)$ (e.g., the voltage of battery 214 measured at time $t_1$ and the voltage of the battery measured at time $t_2$) and the difference between the currents $I(t_1)$ and $I(t_2)$ (e.g., the current of battery 214 measured at time $t_1$ and the current of battery 214 measured at time $t_2$). The difference between $V(t_1)$ and $V(t_2)$ is represented here as $\Delta V$, and the difference between $I(t_1)$ and $I(t_2)$ is represented here as $\Delta I$. Processor 202 may then determine $\Delta V$ divided by $\Delta I$, and the result of this division may then be compared to the predetermined threshold range which may, for example, be stored in memory 204. If $\Delta V$ divided by $\Delta I$ is less than or greater than the predetermined threshold range, method 400 proceeds to step 414 at which the estimated resistance R remains the previously estimated resistance (e.g., the estimated resistance determined at $t_1$, similar to step 410 described above). If the $\Delta V$ divided by $\Delta I$ falls within the predetermined threshold range, method 400 proceeds to step 416.

At step 416, in response to determining that $\Delta V$ divided by $\Delta I$ is within the predetermined threshold range, a recursive updating algorithm is used to calculate a new estimated resistance R for battery 214. For example, processor 202 may use a recursive updating algorithm to determine a new estimated resistance R for battery 214.

In an embodiment, the recursive updating algorithm may use Kalman filtering to recursively update the estimated resistance R of battery 214. While Kalman filtering is used here as an illustrative preferred example, it should be noted that, if desired, any applicable method of filtering, such as least-square method-with-adaptive-weight (LSMAW), may be used to recursively estimate resistance of battery 214. Two filter parameters, S1 and S2, may be set to a value of zero when device 200 is initialized. Once set to initial values, the filter parameters S1 and S2 may be utilized to implement a Kalman filtering as described herein. Parameters S1 and S2 may be updated during the execution of the recursive updating algorithm according to the following equations:

$$S1 = FF*S1 + \Delta I*\Delta I \tag{3}$$

$$S2 = FF*S2 + \Delta I*\Delta V \tag{4}$$

In equation (3), a product of the previous value of parameter S1 is multiplied by a forgetting factor FF, which is generally a value less than one and greater than zero and which is used to weight the previous value of parameter S1. The product of this multiplication is then added to the square of $\Delta I$, which is the change in current output by battery 214 over the time interval from time $t_1$ to time $t_2$ described above in connection with step 408.

In equation (4), a product of the previous value of parameter S2 is multiplied by the forgetting factor FF, which is generally a value less than one and greater than zero and which is used to weight the previous value of parameter S2. The product of this multiplication is then added to the product of $\Delta I$ and $\Delta V$, which is the change in terminal voltage of battery 214 over the time interval from time $t_1$ to time $t_2$ described above in connection with step 408.

As described above, the magnitude of the forgetting factor FF defines a weight assigned to parameters S1 and S2, which represent cumulative previously estimated resistances for battery 214 (e.g., as historical resistance data) and which are used to estimate a present resistance for battery 214. Thus, when the forgetting factor FF is large (closer to 1), previously estimated resistances contribute more to the determination of the estimated resistance R of battery 214 compared to when the forgetting factor FF is small (closer to 0). When the forgetting factor FF is large, the estimated resistance R responds less quickly to changes in the voltage or current of battery 214 compared to when the forgetting factor FF is small. This reduction in responsiveness may be beneficial in that transitory spikes or dips in the voltage and current of battery 214 will not have as much of an impact on the estimated resistance R compared to when the forgetting factor FF is small, resulting in a less noisy estimated resistance R when using a larger value for the forgetting factor FF. From another perspective, during periods in which voltage and current of battery 214 are changing rapidly, it may be beneficial to use a smaller forgetting factor FF when determining estimated battery resistance R so that the battery resistance R may accurately reflect the actual resistance of the battery more quickly. In various embodiments, the value of the FF can selected to control a stability of the estimate resistance R determination. If the FF is set to a higher value (e.g., closer to 1) the estimated resistance calculation is rendered more stable so that the value change more slowly over time and from one estimate to the next. This can make the estimate less susceptible to temporary noise in the data values utilized to estimate resistance. Conversely, if the FF is set to a lower value (e.g., closer to 0) the estimated resistance calculation is rendered less stable so that the value change more quickly over time and from one estimate to the next.

While some embodiments may use a static forgetting factor FF when determining estimated battery resistance R, others may use a dynamic forgetting factor FF that is periodically updated. For example, the dynamic forgetting factor FF may be assigned a smaller value, such as 0.1, when it is detected that either of $\Delta I$ or $\Delta V$ are sufficiently large (e.g., as defined by predetermined thresholds) so that the estimated resistance R can change value comparatively quickly in order to account for the large changes in voltage or current of battery 214. The dynamic forgetting factor FF may also be assigned this smaller value when few previously estimated resistances for battery 214 have been determined since device initialization, as it may not be ideal to provide a comparatively large amount of weight to historical resistance data that is only based on a small number of previously estimated resistances. When it is detected that both ΔI and ΔV are sufficiently small (e.g., as defined by the predetermined thresholds), the dynamic forgetting factor FF may be assigned a larger value, such as 0.999, so that the estimated resistance R is more stable over time and is less susceptible to noise.

Once parameters S1 and S2 have been updated, the estimated resistance R of battery 214 may be updated with a new estimated resistance value according to the following equation:

$$R = S2/S1 \qquad (5)$$

In equation (5), the new estimated resistance value is defined as the quotient of S2 and S1 and is applied to the estimated resistance R of battery 214. By using the recursively updating algorithm to calculate the new estimated resistance value for battery 214, the estimated may be more accurate compared to using a LUT alone or compared to performing a direct resistance calculation from a quotient of the instantaneous current and the instantaneous terminal voltage.

By monitoring change in estimated battery resistance between battery power cycles, it can be determined when a battery is nearing the end of its usable life, and a user can be notified accordingly. Additionally, by monitoring change in estimated battery resistance between battery power cycles, decreases in estimated battery resistance that occur between battery power cycles can be identified so that a user can be warned of a potential short in the battery and/or so that the battery may be electrically isolated in an attempt to prevent undesirable events that may occur as a result of internal battery short circuits.

Figure 5A:
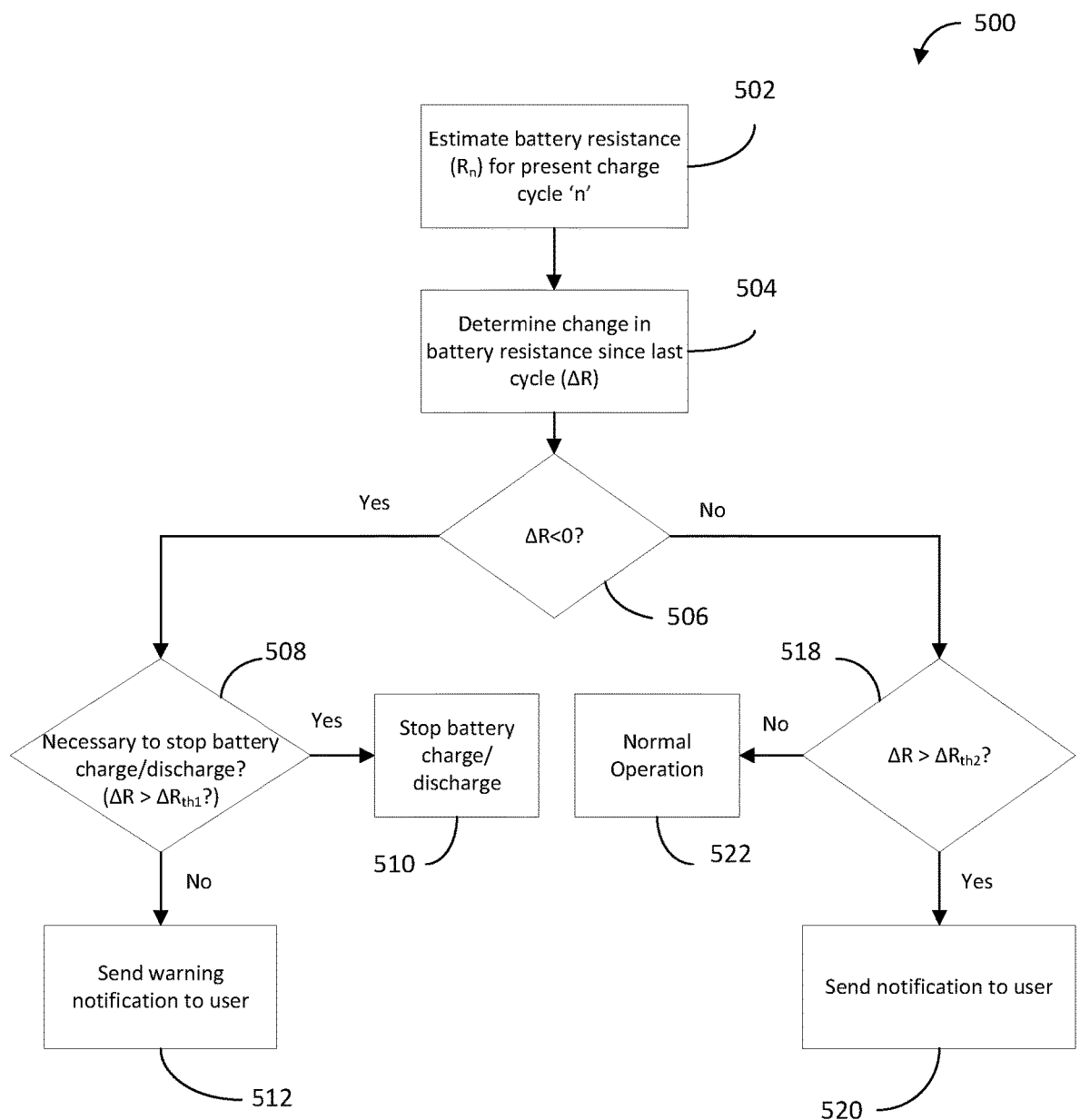
FIG. 5A illustrates an example method for assessing a battery's state of health by tracking the battery's resistance across power cycles, and for taking appropriate action following the assessment.

FIG. 5A illustrates a method 500 by which a device, such as device 200 of FIG. 2, (or any analogous device) may assess the state of health of a battery, such as battery 214 of FIG. 2, by tracking the battery's resistance across consecutive power cycles (sometimes referred to as charge cycles), and for taking appropriate action following the assessment. A power cycle may refer to the process of fully charging a device's battery followed by the device's battery being fully discharged. As such, a power cycle describes a device activity that encompasses at least a first period (e.g., a charging period) in which the device's battery undergoes charging, following by at least a second period (e.g., a discharging period) in which the device's battery is subsequently discharged. Because, during use, devices may not be reliably fully charged and discharged and are, instead, only partially charged and discharged during use, a single power cycle could include multiple charging periods and discharging periods.

Power cycles can be defined in a number of different ways to account for the partial discharge (and battery charging) that may occur during real-world utilization of a typical device. For example, a power cycle may be defined as beginning at the time a device's battery is fully charged to 100% SoC. The power cycle continues until the battery's SoC has fallen below 100% to another SoC value (e.g., 90% or 80%) and will continue until the time the battery is recharged back to 100% SoC, at which point a new power cycle is entered. In some other cases, because users may not typically fully re-charge a device's battery to 100% SoC, an alternative definition for a power cycle may be utilized. For example, a power cycle may start at the time a device's battery is charged above an 80% SoC and then continue until the battery is first discharged to an SoC below a threshold (e.g., 20%) and then re-charged back to at least an 80% SoC, at which point a new power cycle is entered. This definition, may be appropriate for devices that include batteries that are not routinely fully charged or discharged.

In some cases, the definition of power cycle may be such that the power cycle begins when a device's battery reaches a particular state of discharge. For example, a power cycle may begin at the time a device's battery is discharged below a threshold SoC (e.g., 20% SoC) and then continue until the device's battery is charged above another threshold SoC (e.g., 80% SoC) and subsequently discharged below the first threshold SoC (e.g., 20% SoC).

Alternatively, a power cycle may be defined based on battery usage time. For example, a particular device may be characterized to determine that, with the battery fully charged, the device can be utilized for a particular period of time (e.g., 4 hours) using battery power alone and without recharging. Given that period of time, it is possible to determine a use time duration for the device that would constitute a power cycle (i.e., a period involving both discharge and charging of the battery). In the case of a device having a 4 hour battery use time following a full charge for example, the power cycle may have a duration of 5 hours of device use time. In that case, if the device has been used for 5 hours, it is possible to infer that the device's battery must have been recharged during that time period, because the device can only operate for 4 hours without being recharged. Following every 5 hours of device use time, therefore, a new power cycle is entered. In still other embodiments, a power cycle may be defined as a duration of time equal to the battery use time that would typically result in a full discharge of the battery.

Depending upon the typical application and use of a device, different definitions of a power cycle may be utilized. Although examples are given above that mention specific SoC or duration values, it should be understood that depending upon the device, battery, and device's application, any appropriate values may be utilized to implement an appropriate definition of power cycle.

During operation of the device, a controller monitors device operations (and, specifically, charging and discharge of the battery) to detect each transition into a new power cycle. Upon detecting the transition into a new power cycle the controller may update a counter that tracks a number of power cycles executed by the device's battery, for example, stored in memory 204. Processor 202 may detect that battery 214 is in a charging period of a power cycle by determining that a charging device is interfaced with intelligent charging port or switch 218, and that electrical current is being provided to battery 214 thereby. Processor 202 may detect that battery 214 is in a discharging period of a power cycle by determining that no current is being provided to battery 214 while device 200 is on and/or that no charging device is interfaced with intelligent charging port or switch 218. In an embodiment, processor 202 may detect the end of a power cycle and the beginning of a new power cycle by detecting that a voltage measurement across battery 214 is at a maximum battery voltage value or is at a 100% SoC (e.g., indicating that battery 214 is fully charged). Method 500 may be implemented, for example, by a controller or processor of the device, such as processor 202 of FIG. 2.

During the execution of method 500, as the device goes through one power cycle after another, processor 202 continually determines at least one estimated battery resistance value in each power cycle and stores those values in a table or database as historical values of estimate battery resistance. Accordingly, before the execution of step 502, a prior historical value of estimated battery resistance in a preceding power cycle has been determined and stored by processor 202. In an embodiment, the various battery resistance values estimated in each power cycle are estimated when the battery is at the same SoC in each power cycle, to provide that the comparisons of estimated battery resistance values from one power cycle to the next are accurate.

Accordingly, at step 502, a first estimated battery resistance value $R_n$ is determined for the battery for the present power cycle 'n'. For example, the first estimated battery resistance value $R_n$ may be determined by processor 202 using method 400 of FIG. 4 in response to determining that the battery 214 is at a predetermined SoC (e.g., 70% SoC). The first estimated battery resistance value $R_n$ may, for example, be stored in memory 204 for use in future iterations of method 500.

At step 504, the change in battery resistance $\Delta R$ from the immediately preceding power cycle 'n−1' to the present power cycle 'n' is determined. Note that various scenarios corresponding to different possible values of the change in battery resistance $\Delta R$ are described below in connection with FIG. 5B. For example, the change in battery resistance $\Delta R$ may be determined by processor 202 by first retrieving the historical battery resistance value for the preceding power cycle $R_{n-1}$ and then subtracting $R_{n-1}$, the second estimated battery resistance value, from the first estimated battery resistance value $R_n$. $R_{n-1}$ is a historical estimated battery resistance value stored by processor 202 during the immediately preceding power cycle 'n−1' (e.g., according to method 400 of FIG. 4) in response to determining that the battery 214 is at the same predetermined SoC value (e.g., 70% SoC) at which $R_n$ is determined. In this way, the second estimated battery resistance value $R_{n-1}$ and the first estimated battery resistance value $R_n$ may be determined at the same SoC value of the battery resistance during their respective power cycles, in order to ensure that battery conditions are similar for each battery resistance estimation.

In some other embodiments, when determining the estimated battery resistance values, processor 202 may ensure that additional conditions are met so that the resistance values are suitable for comparison. For example, as part of step 502, processor 202 may, when determining the first estimated battery resistance value $R_n$, determine that the battery is in the same condition (i.e., discharging or charging) as when the second estimated battery resistance value $R_{n-1}$ was determined. Processor 202 may determine that the battery is charging by detecting that a charging device is interfaced with intelligent charging port or switch 218, or may determine that the battery is discharging by detecting that no charging device is interfaced with intelligent charging port or switch 218. The estimated battery resistance values be determined during the same type of battery state (e.g., a charging state or a discharging state) because resistance values of a battery may be different during charging than they are during discharging, even when determined at the same SoC value of the battery. For example, processor 202 may determine that the battery is charging by detecting that a charging device is interfaced with intelligent charging port or switch 218 and that the SoC of the battery is at a predetermined value (e.g., 90% SoC) during power cycle 'n−1' and may estimate $R_{n-1}$ in response. Processor 202 may then determine that the battery is charging by detecting that a charging device is interfaced with intelligent charging port or switch 218 and that the SoC of the battery is at the predetermined value during power cycle 'n' and may estimate $R_n$ in response.

At step 506, processor 202 determines whether the change in battery resistance $\Delta R$ is less than 0. In this way, it can be determined whether the resistance of the battery has decreased from one power cycle to the next power cycle, which may indicate a problem with the battery as battery resistance is generally expected to increase from one power cycle to the next. If the change in battery resistance $\Delta R$ is less than zero (indicating that the battery internal resistance has decreased from one power cycle to the next), method 500 proceeds to step 508. Otherwise, method 500 proceeds to step 518.

When a battery's resistance decreases (i.e., $\Delta R$ is less than zero) from one power cycle to the next, that can be an indicator that a short circuit is beginning to form in the battery or is already present in the battery. Such a short circuit may be undesirable, as it may result in the generation of excessive heat in the battery, among other potentially negative consequences. It would therefore be advantageous to notify a user if battery resistance decreases between consecutive power cycles. Such a notification could also identify potential consequences thereof (e.g., if there is still time for such an alert to be provided before short-circuit-related failure of the battery) or to electrically isolate the battery if the magnitude of the decrease in battery resistance between consecutive power cycles is sufficiently high (e.g., in order to prevent excessive heat buildup in the battery).

Figure 5B:
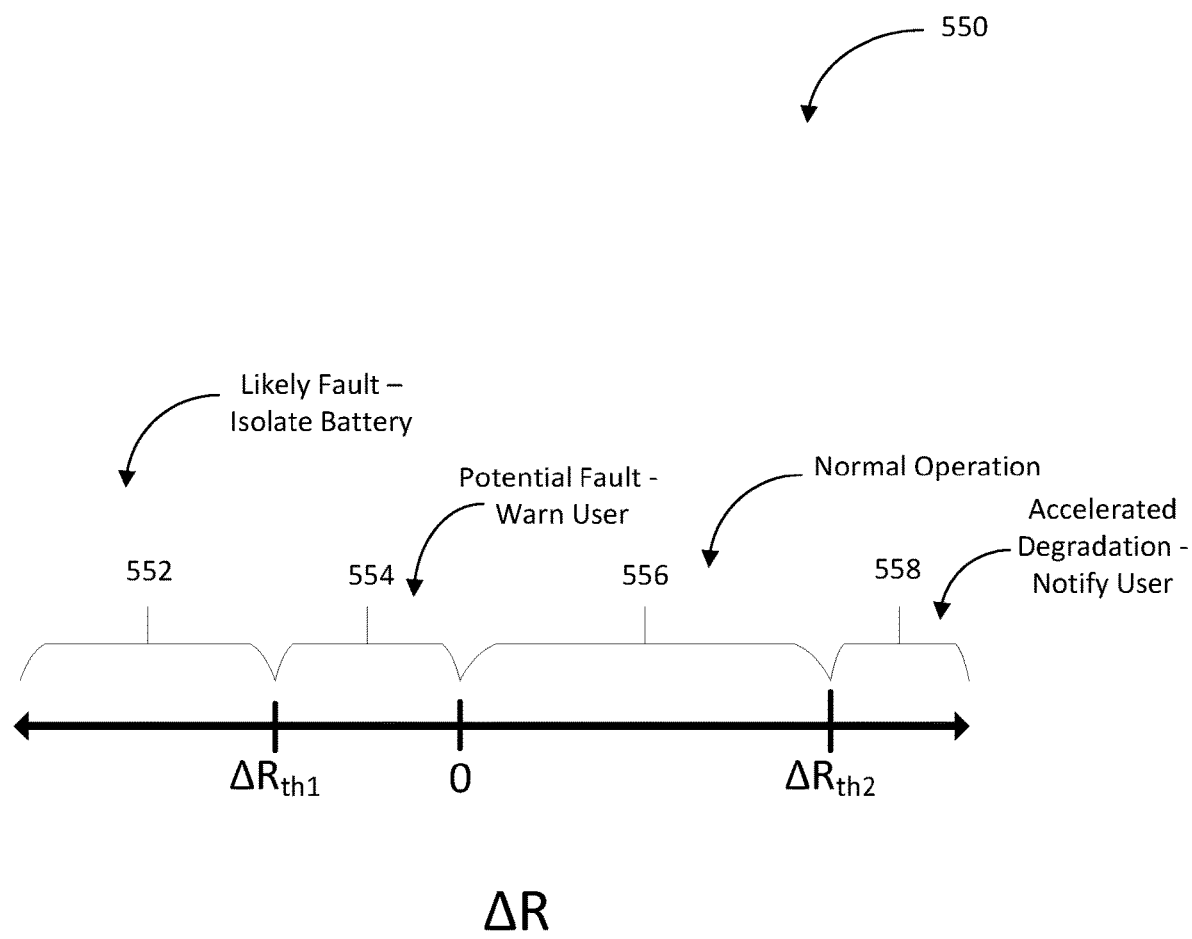
FIG. 5B illustrates a number line showing possible battery health issues that can be indicated by different changes in resistance between power cycles, and corresponding actions that can be taken in response to determining these battery health issues.

Accordingly, at step 508, it is determined whether the battery's resistance has fallen by a sufficient amount to indicate that battery failure is imminent. Accordingly, if a magnitude of the change in battery resistance $\Delta R$ is determined by processor 202 to be sufficiently large when the change in battery resistance $\Delta R$ is negative, processor 202 may take steps to electrically isolate the battery in order to prevent the battery from continuing to charge or discharge. For example, it may be determined by processor 202 whether the change in battery resistance $\Delta R$ is less than a first predetermined resistance difference threshold value $\Delta R_{th1}$ (e.g., whether the change in battery resistance $\Delta R$ falls within range 552 or within range 554, as shown in FIG. 5B), which may be a negative value. For example, the magnitude of the first predetermined resistance difference threshold value $\Delta R_{th1}$ may have a magnitude equal to a percentage (e.g., a predetermined percentage between 10% and 50%) of the expected resistance change of a battery from one power cycle to the next power cycle. Thus, if $\Delta R_{th1}$ is defined as a negative value equal to 50% of the expected increase in resistance of a new battery from one power cycle to the next, and the expected increase in resistance of a new battery is 0.02Ω, then $\Delta R_{th1}$ would be defined as −0.01Ω. It should be noted that the percentage used to define $\Delta R_{th1}$ for a given battery may vary depending on the particular type and chemical makeup of the given battery.

If the change in battery resistance $\Delta R$ is less than the first predetermined resistance difference threshold value $\Delta R_{th1}$, method 500 proceeds to step 510. Otherwise, if the change in battery resistance $\Delta R$ is greater than the first predetermined resistance difference threshold value $\Delta R_{th1}$, method 500 proceeds to step 512.

At step 510, in response to determining that the change in battery resistance $\Delta R$ is less than the first predetermined resistance difference threshold value $\Delta R_{th1}$ (e.g., the change in battery resistance $\Delta R$ falls within range 552 of FIG. 5B), the battery is electrically isolated to prevent further charging/discharging. For example, processor 202 may control one or more switches (for example, a switch located within power management module 216) to electrically isolate battery 214 (i.e., by disconnecting the battery from other components of the device), either by sending control signals to control terminals of the switch(es) directly, or by instructing power management module 216 to control the switches or execute other functions to electrically isolate the device's battery from other components of the device. For example, the switch may be operated to electrically isolate the battery from processor 202 of device 200, thereby preventing electrically energy from being discharged from the battery. Alternatively, the switch may further operate to electrically isolate the battery from other current-consuming components of device 200, such as a backlight or front light, display 206, communication element 210, and the like.

At step 512, in response to determining that the change in battery resistance ΔR is greater than the first predetermined resistance difference threshold value $\Delta R_{th1}$ (e.g., the change in battery resistance ΔR falls within range 554 of FIG. 5B), a notification is provided to the user. Specifically, the user may be notified that the battery is experiencing an internal fault, that the device will be shut down, and the battery should be replaced. An example output notification is illustrated by message 804 of FIG. 8. For example, processor 202 may provide notification 804 to the user of device 200 through a display element 206 of device 200 or a speaker of device 200. This notification may warn the user that the battery is malfunctioning (because a decrease in internal resistance of battery 214 may be indicative of a fault or potential fault) and the device may be automatically shut down soon, or may indicate that the battery should be immediately removed. In an embodiment, processor 202 may also proactively control one or more switches to electrically isolate battery 214 in order to prevent battery 214 from being charged (while potentially allowing battery 214 to continue discharging), as charging battery 214 under these conditions could exacerbate issues with the fault in the battery. Alternatively, processor 202 may instruct power management module 216 to perform this electrical isolation function.

Returning to step 506, in response to determining that the change in battery resistance ΔR is not less than zero (indicating that the battery resistance has increased from one power cycle to the next), it is determined in step 518 whether the change in battery resistance ΔR is greater than a second predetermined resistance difference threshold value $\Delta R_{th2}$ (e.g., by processor 202 of FIG. 2). In this way, it can be determined whether the resistance of the battery is increasing too quickly (e.g. more quickly than expected) from one power cycle to the next, which can be a sign of accelerated battery degradation. The second predetermined resistance difference threshold value $\Delta R_{th2}$ may represent an increase in battery resistance that is expected to occur between power cycles during typical battery operation plus an acceptable tolerance value. For example, batteries corresponding to the battery used in the device (e.g., battery 214 of device 200 of FIG. 2) may be tested (e.g., prior to the manufacture of the device, during characterization) in order to determine the average expected value of battery resistance increase that is observed to occur from one power cycle to the next, and this average expected value summed with an acceptable tolerance value and the result of this sum may be subsequently may be stored in memory of the device (e.g., in memory 204 of FIG. 2) as the second predetermined resistance difference threshold value $\Delta R_{th2}$. Alternatively, the second predetermined resistance difference threshold value $\Delta R_{th2}$ may be defined based on an estimated number of power cycles that the battery is expected to undergo before battery resistance doubles from its initial battery resistance value. For example, a battery may be predicted to undergo 500 power cycles the resistance of the battery doubles, and $\Delta R_{th2}$ may be defined as the initial battery resistance value divided by 500, thereby defining the expected resistance increase per power cycle. As described above, the first predetermined resistance difference threshold value $\Delta R_{th1}$ may be a negative value having a magnitude equal to a predetermined fraction of the average expected value of battery resistance increase. If the change in battery resistance ΔR is greater than the second predetermined resistance difference threshold value $\Delta R_{th2}$, method 500 proceeds to step 520. Otherwise, method 500 proceeds to step 522.

At step 520, in response to determining that the change in battery resistance ΔR is greater than the second predetermined resistance difference threshold value $\Delta R_{th2}$ (e.g., the change in battery resistance ΔR falls within range 558 of FIG. 5B), a notification is provided to the user indicating that there is an issue with the battery. Specifically, the user may be notified that the battery resistance is increasing more quickly than anticipated and that the battery should be replaced. An example output notification is illustrated by message 802 of FIG. 8. For example, notification 802 may be provided by processor 202 to the user through display element 206 or a speaker of device 200. The notification may indicate that the battery is degrading at an accelerated rate and should be replaced.

At step 522, in response to determining that the change in battery resistance ΔR is not greater than the second predetermined resistance difference threshold value $\Delta R_{th2}$ (e.g., the change in battery resistance ΔR falls within range 556 of FIG. 5B), the device may proceed with normal operations.

FIG. 5B shows a number line 550 showing possible values for change in battery resistance ΔR from one power cycle to the next. Ranges 552, 554, 556, and 558 are represented on number line 550, each representing a range of values for change in battery resistance ΔR indicative of a respectively different battery condition.

At range 552, when ΔR is less than the first predetermined resistance difference threshold value $\Delta R_{th1}$, a fault (e.g., an internal short) has likely occurred in the battery. In an embodiment, processor 202 may electrically isolate battery 214 (e.g., by controlling a switch coupled to battery 214) in response to determining that the value of ΔR is in range 552.

At range 554, when ΔR is less than 0 and greater than the first predetermined resistance difference threshold value $\Delta R_{th1}$, a fault could potentially occur in the battery imminently. Processor 202 may cause a warning to be provided to a user (e.g., by displaying the warning on an electronic screen of device 200) in response to determining that the value of ΔR is in range 554. The notification may, for example, warn the user that a fault has been detected in the battery and/or that battery 214 will be isolated within a predetermined time frame, resulting in device 200 being shut down.

At range 556, when ΔR is greater than 0 and less than the second predetermined resistance difference threshold value $\Delta R_{th2}$, the increase in resistance between cycles may be considered acceptable and normal operation of the battery may continue.

At range 558, when ΔR is greater than the second predetermined resistance difference threshold value $\Delta R_{th2}$, the battery's resistance is increasing at an accelerated rate, which can be indicative that the battery is approaching the end of its usable life. Processor 202 may cause a notification to be provided to a user (e.g., by displaying the notification on an electronic screen of device 200) in response to determining that the value of ΔR is in range 558. The notification may, for example, inform the user that the battery is degrading at an accelerated rate and/or that the battery should be replaced soon.

In addition to detecting and monitoring changes in battery resistance to detect potential battery failures, the battery's capacity to store electrical charge, referred to herein as the battery's capacity value, can change from one power cycle to the next and may be used to determine a general health of a device's battery. As used herein, battery capacity is a measure (typically in Amp-hours) of charge stored capable of being stored by the battery. In other words, battery capacity represents the maximum amount of energy that can be extracted from the battery under certain specified conditions. Again, if abnormal changes in the battery's capacity from one power cycle to the next are detected, notifications of the same can be provided to a user of the device, enabling the user to replace the battery before potential failure of the battery.

Figure 6:
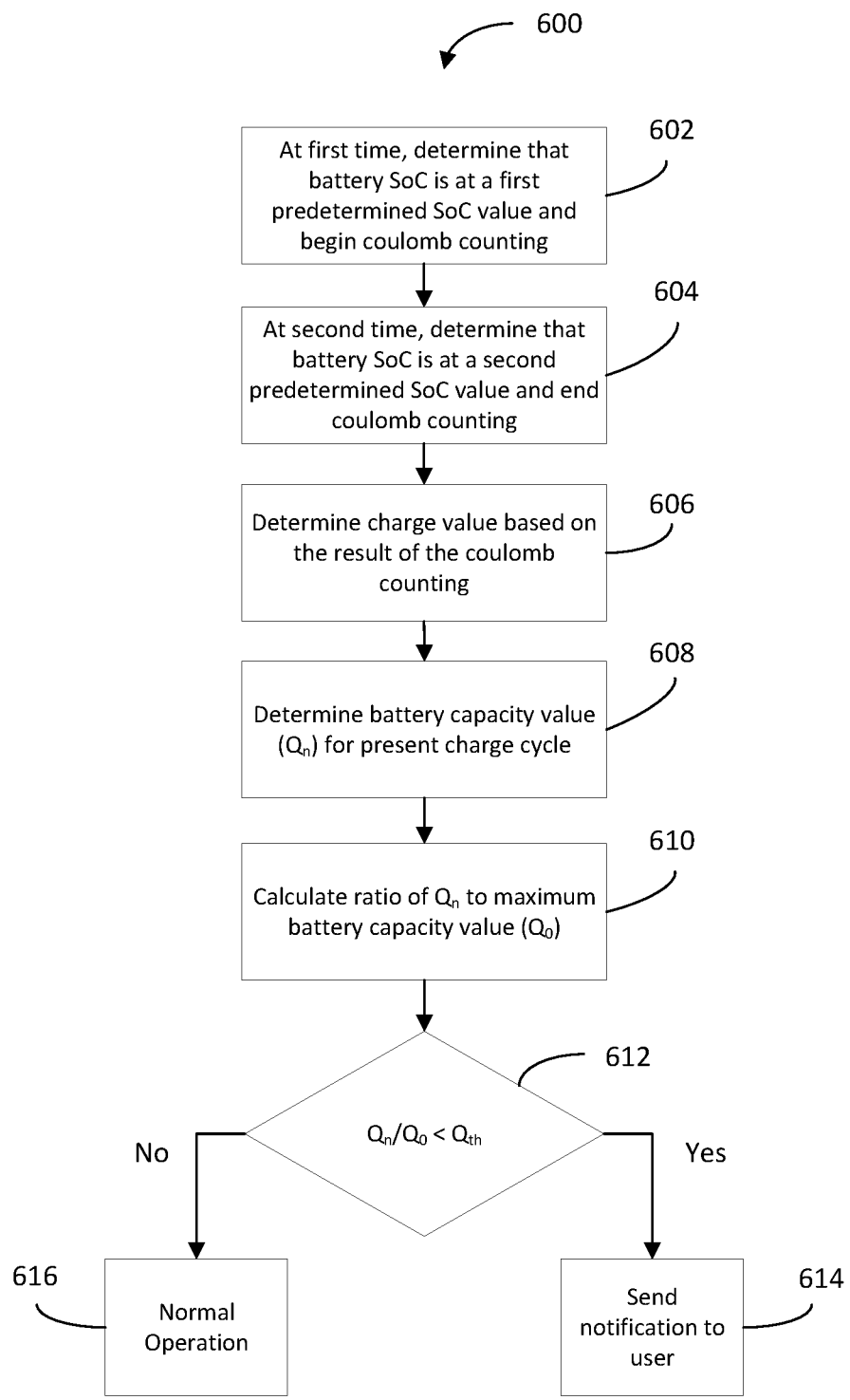
FIG. 6 illustrates an example method for assessing a battery's state of health by tracking the battery's capacity across power cycles, and for taking appropriate action following the assessment.

For example, FIG. 6 illustrates a method 600 by which a device, such as device 200 of FIG. 2, may assess a state of health for a battery, such as battery 214 of FIG. 2, in the device by tracking the battery's capacity across power cycles, and for taking appropriate action following the assessment. Method 600 may be implemented, for example, by a controller or processor of the device, such as processor 202 of FIG. 2. By monitoring the battery capacity value over time, and comparing the battery capacity value to an original battery capacity value (e.g., the battery capacity value of a new battery), it can be determined when the battery is nearing the end of its usable life, and a user can be notified accordingly. The method generally involves processor 202 determining the battery's capacity, measured in amount of charge flowing into or out of the battery, as the battery transitions from one SoC (e.g., 80%) to a second SoC (e.g., 70%). By measuring the amount of charge flowing into or out of the battery when transitioning between SoC values, the overall battery capacity can be determined and compared to nominal battery capacity values to detect degradation in the battery.

At step 602, while periodically monitoring the SoC of the battery (e.g., using method 300 of FIG. 3), it is determined at a first time that the SoC of the battery is at a first predetermined SoC value $SoC_1$ (e.g., 70% SoC) and coulomb counting, also referred to herein as charge counting, begins. Coulomb or charge counting refers to a process by which the amount of electrical charge flowing through one or more nodes is counted for a time period (e.g., by integrating electrical current measured at the node(s) over the time period). In the present example, charge counting may be performed for charge flowing into and/or out of one or more terminals of the battery. For example, during a power cycle, at the first time, processor 202 may determine that the SoC of the battery is at $SoC_1$. Processor 202 may then begin coulomb counting in order to determine the amount of charge passing into or out of battery 214 in response to this determination until a second condition is met, at which time coulomb counting may end. Processor 202 may also determine whether the battery is in a charging period (e.g., by detecting whether a charging device is interfaced with intelligent charging port or switch 218) when coulomb counting begins. In an embodiment, the value for $SoC_1$ may be a predetermined static value that is retrieved from memory 204 by processor 202. In another embodiment, processor 202 may select a value for $SoC_1$ from a table (e.g., a look-up table (LUT)) of predetermined acceptable SoC values stored in memory 204.

At step 604, while periodically monitoring the SoC of the battery (e.g., using method 300 of FIG. 3), it is determined that the SoC of the battery is at a second predetermined SoC value $SoC_2$ (e.g., 60% SoC) at a second time and coulomb counting ends. In an embodiment, the value for $SoC_2$ may be a predetermined static value that is retrieved from memory 204 by processor 202. In another embodiment, processor 202 may select a value for $SoC_2$ from a table (e.g., a look-up table (LUT)) of predetermined acceptable SoC values stored in memory 204 (e.g., based on the value that was selected for $SoC_1$). In another embodiment, processor 202 may dynamically determine a value for $SoC_2$ that is sufficiently greater than (for a charging period) or less than (for a discharging period) the value of $SoC_1$ (e.g., according to a predetermined acceptable SoC difference threshold value stored in memory 204).

For example processor 202 may determine that the SoC of the battery is at $SoC_2$ at the second time and that the battery is still within the same charging period or discharging period in which the coulomb counting began (e.g., by monitoring, for a charging period, intelligent charging port or switch 218 to ensure that a charging device has not ceased interfacing with the charging port since coulomb counting began, or by monitoring, for a discharging period, intelligent charging port or switch 218 to ensure that a charging device has not begun interfacing with the charging port since coulomb counting began). Processor 202 may then end coulomb counting in response to this determination. If processor 202 determines that the present charging period or discharging period has ended (e.g., by determining that a charging device has interfaced with intelligent port or switch 218 during a discharge period, or by determining that a charging device is no longer interfaced with intelligent port or switch 218 during a charge period) before the SoC of the battery is at $SoC_2$, method 600 may be ended without a battery capacity value for the present power cycle being recorded for the battery. In such instances, method 600 may begin again at step 602 during a subsequent power cycle, for example.

At step 606, a charge count value may be determined as a result of the coulomb counting that was performed from the first $SoC_1$ (at the first time) to the second $SoC_2$ (at the second time). For example, processor 202 may determine the charge count value by integrating the current flowing into or out of battery 214 from $SoC_1$ to $SoC_2$. The charge count value corresponds to the total amount of electrical charge that entered or left the battery as the battery has transitioned from the first $SoC_1$ to the second $SoC_2$.

At step 608, a battery capacity value $Q_n$ is determined for the present power cycle 'n' based on the charge count value. For example, the battery capacity value $Q_n$ may be determined by processor 202 by dividing the charge count value by a difference between $SoC_1$ and $SoC_2$. As an illustrative, non-limiting example, given a charge count value of 0.2 Ampere Hours (Ah), a first predetermined SoC value of 80% (e.g., 0.8) and a second predetermined SoC value of 70% (e.g., 0.7), the calculated battery capacity value $Q_n$ would be 2 Ah (e.g., because 0.2/[0.8−0.7]=2).

At step 610, a ratio of the battery capacity value $Q_n$ to a maximum battery capacity value $Q_0$ is determined. For example, processor 202 may determine the ratio of the battery capacity value $Q_n$ to the maximum battery capacity value $Q_0$. Predetermined maximum battery capacity value $Q_0$ may, for example, be stored in memory 204 of device 200. Maximum battery capacity value $Q_0$ corresponds to the initial battery capacity value (e.g., the off-the-shelf battery capacity value) of battery 214 before it undergoes any charge cycling as part of device 200.

At step 612, it is determined whether the ratio of the battery capacity value $Q_n$ to the maximum battery capacity value $Q_0$ is less than a predetermined battery capacity ratio threshold value $Q_{th}$. In this way, it may be determined whether the capacity of the battery is low enough so as to cause the battery's performance and/or lifespan to be undesirably reduced. For example, processor 202 may determine if the ratio is less than the predetermined battery capacity ratio threshold value $Q_{th}$. Predetermined battery capacity ratio threshold value $Q_{th}$ may, for example, be stored in memory 204 of device 200. Predetermined battery capacity ratio threshold value $Q_{th}$ corresponds to a ratio of $Q_n$ to $Q_0$ below which it has been determined (e.g., during device/battery characterization) that battery performance and/or lifespan may be undesirably reduced. If it is determined that the ratio of the battery capacity value $Q_n$ to the maximum battery capacity value $Q_0$ is less than $Q_{th}$, then method 600 proceeds to step 614. Otherwise, if it is determined that the ratio of the battery capacity value $Q_n$ to the maximum battery capacity value $Q_0$ is not less than $Q_{th}$, then method 600 proceeds to step 616.

At step 614, in response to determining that the ratio of the battery capacity value $Q_n$ to the maximum battery capacity value $Q_0$ is less than $Q_{th}$, a notification is provided to the user indicating that there is an issue with the battery. Specifically, the user may be notified that the battery capacity has significantly decreased as compared that the battery's original battery capacity value. The user may also be notified that the battery should be replaced. An example output notification is illustrated by message 806 of FIG. 8. For example, notification 806 may be provided by processor 202 to the user through display element 206 or a speaker of device 200. The notification may indicate that the battery's capacity has degraded and that the battery should be replaced.

At step 616, in response to determining that the ratio of the battery capacity value $Q_n$ to the maximum battery capacity value $Q_0$ is not less than $Q_{th}$, the device may continue with normal operations as this determination may indicate normal battery operation and performance.

In addition to monitoring a battery's capacity over time, and comparing the battery's capacity to the original, maximum capacity of the battery, it may be possible to monitor the rate of change of the battery's capacity over time (e.g., across multiple power cycles). As a battery ages, the battery's capacity (e.g., the maximum amount of electrical charge that the battery may hold; quantified by battery capacity values Q) decreases. This change in the battery's capacity may not occur linearly. For example, the battery's capacity may decrease more rapidly (e.g., at an accelerated rate) as the battery approaches the end of its usable life, after which the battery will require replacement. It may therefore be beneficial to detect when this accelerated rate of change of battery capacity occurs in order to predict when the battery will need to be replaced. By monitoring the rate of change of a battery's capacity, it can be determined when the battery begins to degrade at an accelerated rate (e.g., at a rate greater than expected), and a user can be notified accordingly.

While method 600 may be performed once per power cycle in some embodiments, in other embodiments, method 600 may instead may be performed for multiple iterations within a single power cycle, with different values for $SoC_1$ and $SoC_2$ being used for each iteration in such instances. In this way, the battery's capacity can still be determined for circumstances in which, for example, the SoC of the battery never leaves a certain range (e.g., 50%-70% SoC) due to user charging habits.

Figure 7:
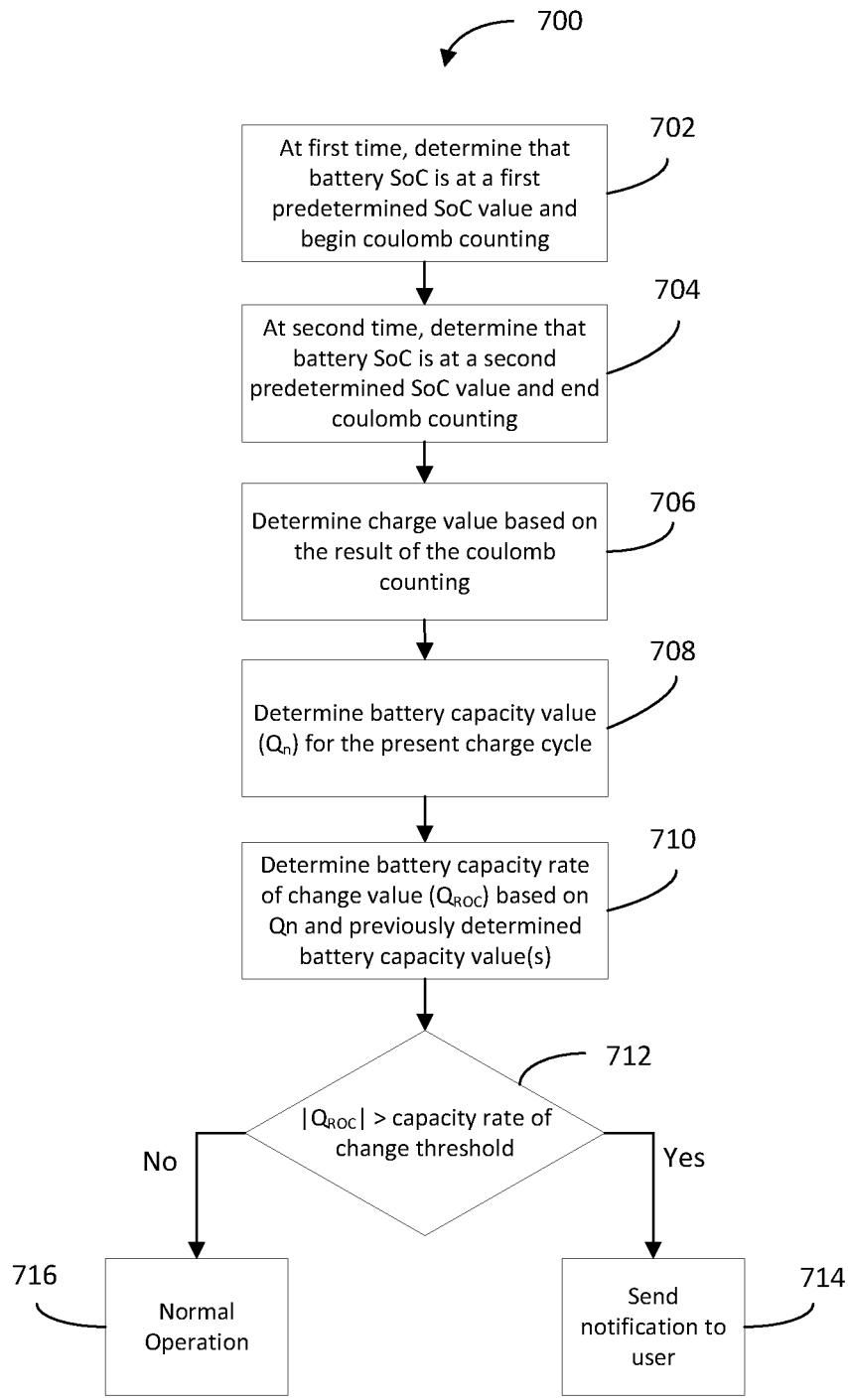
FIG. 7 illustrates an example method for assessing a battery's state of health by tracking the battery's capacity rate of change across power cycles, and for taking appropriate action following the assessment.

FIG. 7 illustrates a method 700 by which a device, such as device 200 of FIG. 2, may assess a state of health for a battery, such as battery 214 of FIG. 2, in the device by tracking the battery's capacity rate of change across power cycles, and for taking appropriate action following the assessment. Method 700 may be implemented, for example, by a controller or processor of the device, such as processor 202 of FIG. 2.

At step 702, while periodically monitoring the SoC of the battery (e.g., using method 300 of FIG. 3), it is determined at a first time that the SoC of the battery is at a first predetermined SoC value $SoC_1$ (e.g., 70% SoC) and coulomb counting begins. For example, during a power cycle, at the first time, processor 202 may determine that the SoC of the battery is at $SoC_1$. Processor 202 may then begin coulomb counting in order to determine the amount of charge passing into or out of battery 214 in response to this determination until a second condition is met, at which time coulomb counting may end. Processor 202 may also determine whether the battery is in a charging period (e.g., by detecting whether a charging device is interfaced with intelligent charging port or switch 218) when coulomb counting begins. In an embodiment, the value for $SoC_1$ may be a predetermined static value that is retrieved from memory 204 by processor 202. In another embodiment, processor 202 may select a value for $SoC_1$ from a table (e.g., a look-up table (LUT)) of predetermined acceptable SoC values stored in memory 204.

At step 704, while periodically monitoring the SoC of the battery (e.g., using method 300 of FIG. 3), it is determined at a second time that the SoC of the battery is at a second predetermined SoC value $SoC_2$ (e.g., 60% SoC) and coulomb counting ends. In an embodiment, the value for $SoC_2$ may be a predetermined static value that is retrieved from memory 204 by processor 202. In another embodiment, processor 202 may select a value for $SoC_2$ from a table (e.g., a look-up table (LUT)) of predetermined acceptable SoC values stored in memory 204 (e.g., based on the value that was selected for $SoC_1$). In another embodiment, processor 202 may dynamically determine a value for $SoC_2$ that is sufficiently greater than (for a charging period) or less than (for a discharging period) the value of $SoC_1$ (e.g., according to a predetermined acceptable SoC difference threshold value stored in memory 204).

For example, at the second time, processor 202 may determine that the SoC of the battery is at $SoC_1$, and that the battery is still within the same charging period or discharging period in which the coulomb counting began (e.g., by monitoring, for a charging period, intelligent charging port or switch 218 to ensure that a charging device has not ceased interfacing with the charging port since coulomb counting began, or by monitoring, for a discharging period, intelligent charging port or switch 218 to ensure that a charging device has not begun interfacing with the charging port since coulomb counting began). Processor 202 may then end coulomb counting in response to this determination. If processor 202 determines that the present charging period or discharging period has ended (e.g., by determining that a charging device has interfaced with intelligent port or switch 218 during a discharge period, or by determining that a charging device is no longer interfaced with intelligent port or switch 218 during a charge period) before the SoC of the battery is at $SoC_2$, method 700 may be ended without a capacity value for the present power cycle being recorded for the battery. In such instances, method 700 may begin again at step 702 during a subsequent power cycle, for example.

At step 706, a charge count value may be determined as a result of the coulomb counting that was performed from the first time to the second time. For example, processor 202 may determine the charge count value by integrating the current flowing into or out of battery 214 from the first time to the second time. The charge count value corresponds to the total amount of electrical charge that entered or left the battery between $SoC_1$ (at the first time) and $SoC_2$ (at the second time).

At step 708, a battery capacity value $Q_n$ is determined for the present power cycle based on the charge count value. For example, the battery capacity value $Q_n$ may be determined by processor 202 by dividing the charge count value by a difference between $SoC_1$ and $SoC_2$. Battery capacity value $Q_n$ may be stored in memory of the device (e.g., memory 204), and in this way battery capacity values for each power cycle may be accumulated in the memory. In an embodiment, processor 202 may determine whether battery 214 is charging or discharging, (e.g., by detecting the state of intelligent charging port or switch 218), the current power cycle of battery 214, and a magnitude of a difference between $SoC_1$ and $SoC_2$. Processor 202 may store this information in a table (e.g., Table 2, below) in memory 204 along with the battery capacity value $Q_n$, and the determined charge count value. In this way, device 200 may record and track the battery conditions under which each battery capacity value Q is determined and may associate those conditions with the corresponding Q value in memory.

At step 710, a battery capacity rate of change value $Q_{ROC}$ may be determined for the battery across multiple power cycles. For example, method 700 (specifically step 708 of method 700) may be performed by processor 202 for each power cycle of battery 214 so that for a given power cycle 'n', battery capacity values $Q_1$ through $Q_{n-1}$ (e.g. corresponding to power cycles '1' through 'n−1') may be stored in memory 204. In an embodiment, processor 202 may only use battery capacity values Q that were determined under the same battery conditions (e.g., based on information collected and stored in memory 204 in step 708). This example is illustrative and non-limiting, and it should be noted that in some embodiments, only battery capacity values for a portion of power cycles (e.g., corresponding to the most recently occurring power cycles) may be stored in memory 204. It should also be noted that in other embodiments, multiple battery capacity values may be determined for a single power cycle (e.g., one battery capacity value for the charging period of the power cycle and another battery capacity value for the discharging period).

In any of these embodiments, the battery capacity rate of change value $Q_{ROC}$ may be determined by processor 202 for some or all of the battery capacity values (including $Q_n$) stored in memory 204 that were determined under the same battery conditions. As an example in which only the four most recently determined battery capacity values $Q_{n-3}$, $Q_{n-2}$, $Q_{n-1}$, and $Q_n$ are used, the battery capacity rate of change value $Q_{ROC}$ may be calculated as:

$$Q_{ROC}=[(Q_{n-3}-Q_{n-2})+(Q_{n-2}-Q_{n-1})+(Q_{n-1}-Q_n)]/3$$

This example is merely illustrative and it should be understood that other appropriate methods of determining the battery capacity rate of change value $Q_{ROC}$ may be used, if desired, including comparing only the two most recent battery capacity values (e.g., $Q_n$ and $Q_{n-1}$).

The rate at which charge or discharge occurs in a battery is generally substantially linear between 90% and 10% SoC, while non-linearities in charge/discharge rate may be observed between 100% and 90% SoC and between 10% and 0% SoC. Thus, it may in order for battery capacity determination to be more accurate between power cycles, it may be desirable to define specific parameters for the values $SoC_1$ and $SoC_2$ that are used to determine each of the battery capacity values Q. For example, when each of the battery capacity values Q are determined, they may be measured using the same values for $SoC_1$ and $SoC_2$ (e.g., $SoC_1$=80% and $SoC_2$=70%) that were and will be used to measure each other battery capacity value of the battery capacity values Q. In this way, the same discharge or charge rate can be expected (effects of battery capacity degradation notwithstanding) when determining each of the battery capacity values Q. As another example, each of the battery capacity values Q may be determined using the same difference in $SoC_1$ and $SoC_2$ (e.g., such that $|SoC_1-SoC_2|$=0.1 (i.e., 10%)) within the substantially linear range between 90% and 10% SoC, so that specific values for $SoC_1$ and $SoC_2$ do not need to be defined (e.g., because the charge rate from 90% SoC to 80% SoC may be substantially the same as the charge rate from 50% to 40%, allowing either pair of SoC values to be used for $SoC_1$ and $SoC_2$). This may be beneficial as, depending on usage habits, some users may never allow the device to enter certain SoC ranges, or may be erratic in their device usage.

For example, for a power cycle 'n−1', a user may charge the battery from 50% SoC to 80% SoC, and $Q_{n-1}$ may be determined using 60% and 70% as the values for $SoC_1$ and $SoC_2$. Then, the user may discharge the battery to 10% SoC. At the next power cycle 'n', the user may charge the battery from 10% to 30% SoC, which does not overlap with the 50% to 80% SoC range that occurred during the power cycle 'n−1'. In such instances, $Q_n$ may be calculated using 20% and 30% as the values for $SoC_1$ and $SoC_2$, as the charging rate between these SoC values may be expected to be substantially equivalent to the charging rate between the SoC values 60% to 70% that were used to determine $Q_{n-1}$. Additionally, when comparing two or more battery capacity values to determine $Q_{ROC}$, it may be important that these battery capacity values are all determined during respective charging periods or are all determined during respective discharging periods, as the rate of charge for a battery between two given SoC values may generally differ from the rate of discharge for a battery between the two given SoC values.

TABLE 2

| Power Cycle (n) | $|SoC_1-SoC_2|$ | Charging/ Discharging | Coulomb Count (Ah) | Q (Ah) |
| --- | --- | --- | --- | --- |
| 1 | 10% | Charging | .1 | 1 |
| 2 | 10% | Charging | .0995 | .995 |
| 3 | 10% | Charging | .099 | .99 |
| 4 | 10% | Charging | .0985 | .985 |

Table 2 illustrates various values that may be stored in memory 204 and that may be used in determining $Q_{ROC}$. Assuming n=4 and using the equation for determining $Q_{ROC}$ described above, the $Q_{ROC}$ of the example data shown in Table 2 may be determined to be −0.005 Ah/power cycle.

At step 712, it is determined whether the magnitude of the battery capacity rate of change value $Q_{ROC}$ is greater than a predetermined capacity rate of change threshold value. In this way, it can be determined whether the capacity of the battery is experiencing accelerated degradation, which could indicate that the battery is nearing the end of its usable lifespan. For example, processor 202 may compare $Q_{ROC}$ to the predetermined capacity rate of change threshold value. The predetermined capacity rate of change threshold value may, for example, be stored in memory 204 of device 200. The predetermined capacity rate of change threshold value corresponds to a capacity rate of change value for the battery above which it has been determined (e.g., during device/battery characterization) that battery capacity is degrading at an accelerated rate (e.g., above the expected rate of battery capacity degradation).

If the battery capacity rate of change value $Q_{ROC}$ is greater than the predetermined capacity rate of change threshold value, then method 700 proceeds to step 714. Otherwise, if the battery capacity rate of change value $Q_{ROC}$ is not greater than the predetermined capacity rate of change threshold value, then method 700 proceeds to step 716.

At step 714, in response to determining that the battery capacity rate of change value $Q_{ROC}$ is greater than the predetermined capacity rate of change threshold value, a notification is provided to the user indicating that there is an issue with the battery. Specifically, the user may be notified that the battery capacity value is decreasing at an accelerated (i.e., at a greater than anticipated) rate and that the battery should be replaced. An example output notification is illustrated by message 808 of FIG. 8. For example, notification 808 may be provided by processor 202 to the user through display element 206 or a speaker of device 200. The notification may indicate that the battery's capacity is degrading at an accelerated rate and that the battery should be replaced.

At step 716, in response to determining that the battery capacity rate of change value $Q_{ROC}$ is not greater than the predetermined capacity rate of change threshold value, the device may continue with normal operations.

Figure 8:
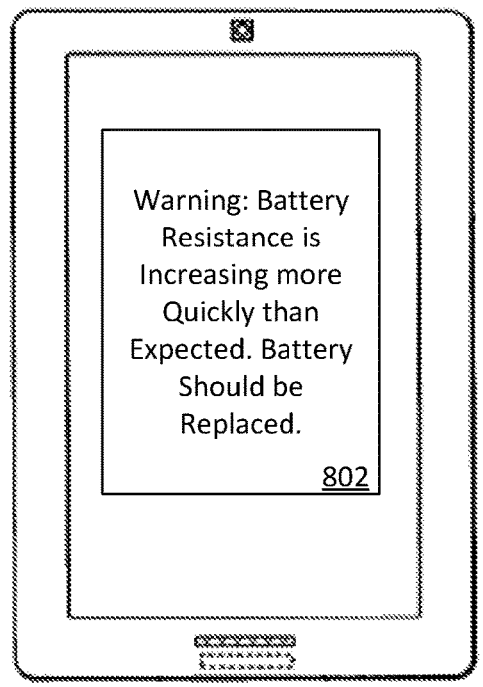
FIG. 8 illustrates warning messages that may be displayed after assessing a battery's state of health.
Figure 8:
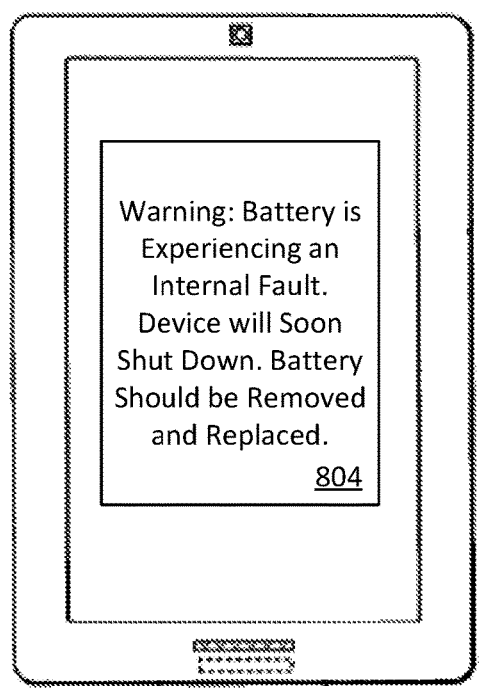
Figure 8:
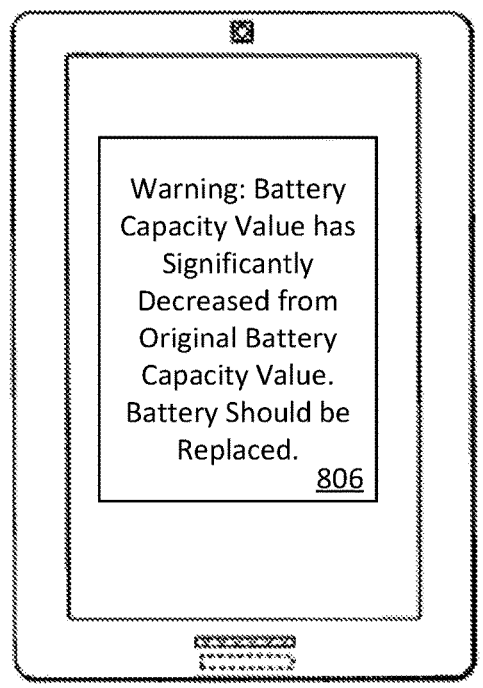
Figure 8:
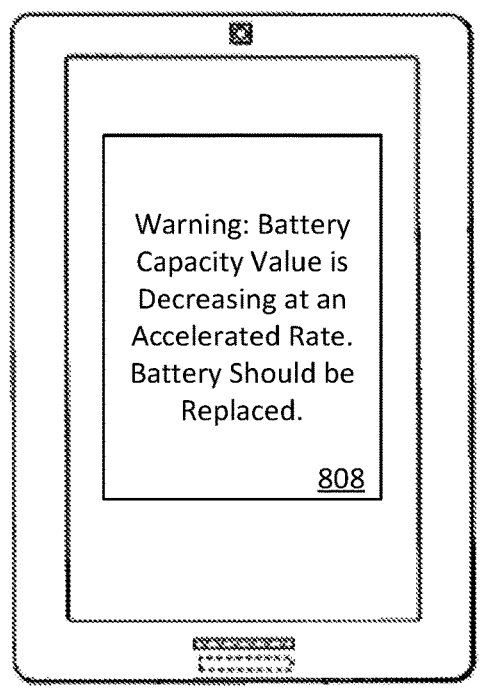

FIG. 8 illustrates different warning messages or notifications that may be displayed on a screen of an electronic device (e.g., on display element 206 of device 200 of FIG. 2), each indicating a different issue with the state of health of a battery (e.g., battery 214 of FIG. 2) in the electronic device.

Message 802 may be displayed after it is determined that a change in battery resistance ΔR is increasing more quickly than expected form one power cycle to the next, which can be a sign of accelerated battery degradation. For example, message 802 may be displayed at step 520 of FIG. 5. Message 802 may warn a user of the unexpectedly rapid increase in battery resistance, and may recommend to the user that the battery be replaced.

Message 804 may be displayed after it is determined that a change in battery resistance ΔR negative, but is still greater than the first predetermined resistance difference threshold value $ΔR_{th1}$, indicating that an internal fault or potential fault exists in the battery. For example, message 804 may be displayed at step 512 of FIG. 5. Message 804 may warn a user of the detection of the internal fault, and may further warn the user that the device will soon shut down. Message 804 may further instruct a user to remove the battery and install a replacement battery.

Message 806 may be displayed after it is determined that the battery's capacity has significantly decreased (e.g., such that battery capacity value $Q_n$ divided by maximum battery capacity value $Q_0$ is less than predetermined battery capacity ratio threshold value $Q_{th}$), which can be a sign that the battery's performance and/or lifespan may be undesirably reduced. For example, message 806 may be displayed at step 614 of FIG. 6. Message 806 may warn a user that the battery's capacity has significantly decreased from the battery's original capacity, and may suggest that the battery should be replaced.

Message 808 may be displayed after it is determined that a rate of change the battery's capacity is decreasing more rapidly than expected (e.g., such that a magnitude of battery capacity rate of change value $Q_{ROC}$ is greater than a predetermined capacity rate of change threshold), which can be a sign that the battery is nearing the end of its usable lifespan. For example, message 808 may be displayed at step 714 of FIG. 7. Message 808 may warn a user that the battery's capacity is decreasing at an accelerated rate, and may suggest that the battery should be replaced.

In an embodiment, a portable electronic device includes a battery and a power management device including a switch. The switch is electrically coupled to the battery. The portable electronic device includes a charging port, a voltage sensor configured to measure a voltage across the battery, a current sensor configured to measure a current generated by the battery, and a controller. The controller is configured to execute instructions for determining that the battery is at a predetermined state of charge value during a first power cycle of the battery, determining a first resistance value for the battery at the predetermined state of charge during the first power cycle, determining that the first power cycle has ended by detecting that a charging device is not connected to the charging port, determining that the battery is at the predetermined state of charge value during a second power cycle of the battery, determining a second resistance value for the battery at the predetermined state of charge during the second power cycle, determining that a first difference equal to the first resistance value subtracted from the second resistance value is less than a threshold value indicating an electrical short within the battery, and causing the power management device to operate the switch to electrically isolate the battery from a processor of the portable electronic device.

In an embodiment, a device includes a battery and a controller. The controller is configured to execute instructions for determining a first resistance value for the battery during a first power cycle of the battery, and determining a second resistance value for the battery during a second power cycle of the battery. The second power cycle is after the first power cycle. The controller is configured to execute instructions for determining that a first difference equal to the first resistance value subtracted from the second resistance value is less than a first predetermined threshold value, and electrically isolating the battery.

In an embodiment, a method includes determining, using a controller in a device, a first resistance value for a battery in the device during a first power cycle of the battery, and determining, using the controller, a second resistance value for the battery during a second power cycle of the battery. The second power cycle is after the first power cycle. The method includes determining, using the controller, that a first difference equal to the first resistance value subtracted from the second resistance value is less a first predetermined resistance difference threshold value, and electrically isolating the battery.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. A portable electronic device, comprising:
    a battery;
    a power management device including a switch, the switch being electrically coupled to the battery;
    a charging port;
    a voltage sensor configured to measure a voltage across the battery;
    a current sensor configured to measure a current generated by the battery; and
    a controller that is configured to execute instructions for:
        determining that the battery is at a predetermined state of charge value during a first power cycle of the battery,
        determining a first resistance value for the battery at the predetermined state of charge value during the first power cycle,
        determining that the first power cycle has ended by detecting that a charging device is not connected to the charging port,
        determining that the battery is at the predetermined state of charge value during a second power cycle of the battery,
        determining a second resistance value for the battery at the predetermined state of charge value during the second power cycle,
        determining that a first difference equal to the first resistance value subtracted from the second resistance value is less than a threshold value indicating an electrical short within the battery, and
        causing the power management device to operate the switch to electrically isolate the battery from a processor of the portable electronic device.

2. The portable electronic device of claim 1, wherein determining the first resistance value for the battery comprises:
    receiving a first voltage value from the voltage sensor, the first voltage value being measured across a first battery terminal of the battery and a second battery terminal of the battery at a first time during the first power cycle;
    receiving a first current value from the current sensor, the first current value being measured at the first battery terminal or the second battery terminal at the first time;
    receiving a second voltage value from the voltage sensor, the second voltage value being measured across the first battery terminal and the second battery terminal at a second time during the first power cycle;
    receiving a second current value from the current sensor, the second current value being measured at the first battery terminal or the second battery terminal at the second time;
    determining a second difference between the first current value and the second current value;
    determining a third difference between the first voltage value and the second voltage value;
    determining a first value for a first filter parameter by summing a square of the second difference with a product of a previously determined second value for the first filter parameter and a forgetting factor, wherein the forgetting factor has a value between 0 and 1;
    determining a third value for a second filter parameter by summing a product of the second difference and the third difference with a product of a previously determined fourth value for the second filter parameter and the forgetting factor; and
    determining the first resistance value by dividing the third value by the first value.

3. The portable electronic device of claim 1, wherein the controller is further configured to execute instructions for:
    determining a first state of charge value for the battery at a third time, the third time being during the first power cycle;
    determining a charge count value by measuring the current generated by the battery from the third time to a fourth time using the current sensor, the fourth time being during the first power cycle;
    determining a second state of charge value for the battery at the fourth time;
    determining a battery capacity value for the battery by dividing the charge count value by a fourth difference between the first state of charge value and the second state of charge value; and
    determining that a ratio of the battery capacity value to a maximum battery capacity value for the battery is less than a predetermined battery capacity ratio threshold value.

4. The portable electronic device of claim 3, wherein the controller is further configured to execute instructions for:
    determining a second battery capacity value for the battery in a third power cycle before the first power cycle;
    determining a battery capacity rate of change value for the battery based on the battery capacity value and the second battery capacity value;

determining that a magnitude of the battery capacity rate of change value for the battery exceeds a predetermined battery capacity rate of change threshold value; and providing a notification indicative of malfunction of the battery.

5. A device, comprising:

a battery; and a controller that is configured to execute instructions for:

determining a first resistance value for the battery during a first power cycle of the battery and at a first state of charge value for the battery, determining a second resistance value for the battery during a second power cycle of the battery, the second power cycle being after the first power cycle, and at the first state of charge value for the battery, determining that a first difference equal to the first resistance value subtracted from the second resistance value is less than a first predetermined threshold value, and electrically isolating the battery.

6. The device of claim 5, wherein the controller is further configured to execute instructions for:

determining a third resistance value for the battery during a third power cycle of the battery, wherein the third power cycle is before the first power cycle;

determining a fourth resistance value for the battery during a fourth charge cycle of the battery, wherein the fourth charge cycle is before the first power cycle and after the third power cycle;

determining a second difference between the third resistance value and the fourth resistance value;

determining that the second difference is greater than a second predetermined resistance difference threshold value; and providing a notification indicative of malfunction of the battery.

7. The device of claim 5, further comprising power management circuitry configured to control charging of the battery, wherein the controller is further configured to execute instructions for:

determining a third resistance value for the battery during a third power cycle of the battery, wherein the third power cycle is before the first power cycle;

determining a fourth resistance value for the battery during a fourth power cycle of the battery, wherein the fourth power cycle occurs before the first power cycle and after the third power cycle;

determining that a second difference between the third resistance value and the fourth resistance value is less than zero and greater than the first predetermined threshold value;

providing a warning indicating that the battery is internally shorted; and instructing the power management circuitry to prevent the battery from being charged.

8. The device of claim 5, wherein the controller is further configured to execute instructions for:

determining the first state of charge value for the battery at a first time during the first power cycle;

determining a charge count value by measuring a current generated by the battery from the first time to a second time during the first power cycle;

determining a second state of charge value for the battery at the second time;

determining a battery capacity value for the battery using the charge count value and a fourth difference between the first state of charge value and the second state of charge value;

determining that a ratio of the battery capacity value to a maximum battery capacity value for the battery is less than a predetermined battery capacity ratio threshold value; and providing a notification indicating that a battery capacity of the battery has diminished compared to an original battery capacity of the battery.

9. The device of claim 8, wherein the controller is further configured to execute instructions for:

determining a second battery capacity value for the battery in a third power cycle before the first power cycle;

determining a battery capacity rate of change value for the battery based on the battery capacity value and the second battery capacity value;

determining that a magnitude of the battery capacity rate of change value for the battery exceeds a predetermined battery capacity rate of change threshold value; and providing a notification indicative of malfunction of the battery.

10. The device of claim 5, wherein the controller is configured to determine the first resistance value by:

receiving a first voltage value for the battery at a first time during the first power cycle;

receiving a first current value for the battery;

receiving a second voltage value for the battery at a second time during the first power cycle;

receiving a second current value for the battery; and determining the first resistance value for the battery based at least on a second difference between the first current value and the second current value and a third difference between the first voltage value and the second voltage value.

11. The device of claim 10, wherein the controller is further configured to determine the first resistance value by:

determining a first value for a first filter parameter by summing a square of the second difference with a product of a previously determined second value for the first filter parameter and a forgetting factor, wherein the forgetting factor has a value between 0 and 1;

determining a third value for a second filter parameter by summing a product of the second difference and the third difference with a product of a previously determined fourth value for the second filter parameter and the forgetting factor; and determining the first resistance value by dividing the third value by the first value.

12. A method comprising determining, using a controller in a device, a first resistance value for a battery in the device during a first power cycle of the battery and at a first state of charge value for the battery, determining, using the controller, a second resistance value for the battery during a second power cycle of the battery, the second power cycle being after the first power cycle, and the first state of charge value for the battery, determining, using the controller, that a first difference equal to the first resistance value subtracted from the second resistance value is less a first predetermined resistance difference threshold value, and electrically isolating the battery.

13. The method of claim 12, further comprising:
determining, with the controller, a third resistance value for the battery during a third power cycle of the battery, wherein the third power cycle is before the first power cycle;
determining, with the controller, a fourth resistance value for the battery during a fourth power cycle of the battery, wherein the fourth power cycle is before the first power cycle and after the third power cycle;
determining, with the controller, a second difference between the third resistance value and the fourth resistance value;
determining, with the controller, that the second difference is greater than a second predetermined resistance difference threshold value; and
providing, with the controller, a notification indicating that the battery is experiencing degradation.

14. The method of claim 12, further comprising:
determining, with the controller, a third resistance value for the battery during a third power cycle of the battery, wherein the third power cycle is before the first power cycle;
determining, with the controller, a fourth resistance value for the battery during a fourth power cycle of the battery, wherein the fourth power cycle occurs before the first power cycle and after the third power cycle;
determining, with the controller, that a second difference between the third resistance value and the fourth resistance value is less than zero and greater than the first predetermined resistance difference threshold value;
providing, with the controller, a warning indicating that the battery is internally shorted; and
instructing, with the controller, power management circuitry in the device to prevent the battery from being charged.

15. The method of claim 12, further comprising:
determining, with the controller, the first state of charge value for the battery at a first time during the first power cycle;
determining, with the controller, a charge count value by measuring a current generated by the battery from the first time to a second time during the first power cycle;
determining, with the controller, a second state of charge value for the battery at the second time;
determining, with the controller, a battery capacity value for the battery using the charge count value and a fourth difference between the first state of charge value and the second state of charge value;
determining, with the controller, that a ratio of the battery capacity value to a maximum battery capacity value for the battery is less than a predetermined battery capacity ratio threshold value; and
providing, with the controller, a notification indicating that a battery capacity of the battery has diminished compared an original battery capacity of the battery.

16. The method of claim 15, further comprising:
determining, with the controller, a second battery capacity value for the battery in a third power cycle before the first power cycle;
determining, with the controller, a battery capacity rate of change value for the battery based on the battery capacity value and the second battery capacity value;
determining, with the controller, that a magnitude of the battery capacity rate of change value for the battery exceeds a predetermined battery capacity rate of change threshold value; and
providing, with the controller, a notification indicative of malfunction of the battery.

17. The method of claim 12, wherein determining the first resistance value comprises:
receiving, with the controller, a first voltage value for the battery at a first time during the first power cycle;
receiving, with the controller, a first current value for the battery;
receiving, with the controller, a second voltage value for the battery at a second time during the first power cycle;
receiving, with the controller, a second current value for the battery; and
determining, with the controller, the first resistance value for the battery based at least on a second difference between the first current value and the second current value and a third difference between the first voltage value and the second voltage value.

18. The method of claim 17, wherein determining the first resistance value further comprises:
determining, with the controller, a first value for a first filter parameter by summing a square of the second difference with a product of a previously determined second value for the first filter parameter and a forgetting factor, wherein the forgetting factor has a value between 0 and 1;
determining, with the controller, a third value for a second filter parameter by summing a product of the second difference and the third difference with a product of a previously determined fourth value for the second filter parameter and the forgetting factor; and
determining, with the controller, the first resistance value by dividing the third value by the first value.

* * * * *